US011488906B2

(12) United States Patent
Cho et al.

(10) Patent No.: US 11,488,906 B2
(45) Date of Patent: Nov. 1, 2022

(54) BRIDGE EMBEDDED INTERPOSER, AND PACKAGE SUBSTRATE AND SEMICONDUCTOR PACKAGE COMPRISING THE SAME

(71) Applicant: SAMSUNG ELECTRO-MECHANICS CO., LTD., Suwon-si (KR)

(72) Inventors: Jung Hyun Cho, Suwon-si (KR); Young Kwan Lee, Suwon-si (KR); Young Sik Hur, Suwon-si (KR); Yun Tae Lee, Suwon-si (KR); Ho Kwon Yoon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 372 days.

(21) Appl. No.: 16/535,421

(22) Filed: Aug. 8, 2019

(65) Prior Publication Data
US 2020/0243450 A1    Jul. 30, 2020

(30) Foreign Application Priority Data

Jan. 24, 2019  (KR) .................. 10-2019-0009366
Apr. 5, 2019   (KR) .................. 10-2019-0040072

(51) Int. Cl.
*H01L 23/538*  (2006.01)
*H01L 23/31*   (2006.01)
(Continued)

(52) U.S. Cl.
CPC ...... *H01L 23/5381* (2013.01); *H01L 23/3157* (2013.01); *H01L 23/49822* (2013.01);
(Continued)

(58) Field of Classification Search
CPC ..... H01L 23/5381; H01L 24/09; H01L 24/33; H01L 23/3157; H01L 23/49861;
(Continued)

(56) References Cited

U.S. PATENT DOCUMENTS 7,669,320 B2 * 3/2010 Hurwitz .............. H01L 21/4857
                                                  29/846
9,601,353 B2 * 3/2017 Huang .............. H01L 23/49811
(Continued)

FOREIGN PATENT DOCUMENTS

TW    201225762 A    6/2012
TW    201814843 A    4/2018
(Continued)

OTHER PUBLICATIONS

Taiwanese Office Action dated Jun. 8, 2022, issued in corresponding Taiwanese Patent Application No. 108127842 (with English translation).
(Continued)

*Primary Examiner* — Duy T Nguyen
(74) *Attorney, Agent, or Firm* — Morgan, Lewis & Bockius LLP

(57) ABSTRACT

A bridge embedded interposer and a package substrate and a semiconductor package including the same includes: a connection structure including one or more redistribution layers, a first bridge disposed on the connection structure and including one or more first circuit layers electrically connected to the one or more redistribution layers, a frame disposed around the first bridge on the connection structure and including one or more wiring layers electrically connected to the one or more redistribution layers, and an encapsulant disposed on the connection structure and covering at least a portion of each of the first bridge and the frame.

20 Claims, 16 Drawing Sheets

(51) Int. Cl.
    *H01L 23/498*   (2006.01)
    *H01L 23/00*    (2006.01)
    *H05K 1/18*     (2006.01)

(52) U.S. Cl.
    CPC .. *H01L 23/49838* (2013.01); *H01L 23/49861* (2013.01); *H01L 23/5383* (2013.01); *H01L 23/5386* (2013.01); *H01L 24/09* (2013.01); *H01L 24/33* (2013.01); *H05K 1/181* (2013.01); *H01L 2224/02372* (2013.01)

(58) Field of Classification Search
    CPC ........... H01L 23/49838; H01L 23/5383; H01L 23/5386; H01L 23/49822; H01L 2224/02372; H01L 2924/15311; H01L 2224/32013; H01L 2224/16227; H01L 2224/32225; H01L 2224/32106; H01L 2224/32105; H01L 2224/13111; H01L 24/29; H01L 24/32; H01L 2224/73204; H01L 24/16; H01L 24/13; H01L 23/49816; H01L 23/50; H01L 23/5385; H01L 21/568; H01L 23/3128; H01L 23/522; H01L 23/528; H01L 23/3121; H05K 1/181
    See application file for complete search history.

(56) References Cited

U.S. PATENT DOCUMENTS

| | | | |
|---|---|---|---|
| 9,754,890 B2 * | 9/2017 | Deshpande | H01L 23/5385 |
| 9,824,973 B2 * | 11/2017 | Lee | H01L 23/5384 |
| 9,881,873 B2 * | 1/2018 | Oh | H01L 23/5386 |
| 9,935,090 B2 * | 4/2018 | Yu | H01L 23/3675 |
| 9,997,446 B2 * | 6/2018 | Kim | H01L 24/09 |
| 10,068,852 B2 | 9/2018 | Mahajan et al. | |
| 10,217,720 B2 * | 2/2019 | Wang | H01L 25/50 |
| 10,224,288 B2 * | 3/2019 | Oh | H01L 23/5386 |
| 10,546,834 B2 * | 1/2020 | Wang | H01L 21/76877 |
| 10,797,000 B2 * | 10/2020 | Deshpande | H01L 23/5385 |
| 11,094,637 B2 * | 8/2021 | Rubin | H01L 23/5381 |
| 2006/0202322 A1 | 9/2006 | Kariya et al. | |
| 2007/0289127 A1 * | 12/2007 | Hurwitz | H05K 3/4697 29/827 |
| 2012/0146209 A1 | 6/2012 | Hu et al. | |
| 2013/0048361 A1 * | 2/2013 | Yamashita | H01L 23/49822 174/260 |
| 2014/0355931 A1 * | 12/2014 | Tummala | G02B 6/43 264/1.27 |
| 2016/0343666 A1 * | 11/2016 | Deshpande | H01L 25/0655 |
| 2017/0053872 A1 * | 2/2017 | Lee | H01L 21/76898 |
| 2017/0263522 A1 | 9/2017 | Kim et al. | |
| 2017/0365558 A1 * | 12/2017 | Oh | H01L 23/5383 |
| 2018/0033733 A1 * | 2/2018 | Oh | H01L 23/5389 |
| 2018/0040548 A1 * | 2/2018 | Kim | H01L 23/5383 |
| 2018/0102311 A1 | 4/2018 | Shih | |
| 2018/0138151 A1 | 5/2018 | Shih et al. | |
| 2018/0204791 A1 | 7/2018 | Chen et al. | |
| 2018/0301352 A1 * | 10/2018 | Hsu | H01L 21/4853 |
| 2018/0366416 A1 | 12/2018 | Wang et al. | |
| 2018/0366436 A1 * | 12/2018 | Wang | H01L 25/16 |
| 2019/0148339 A1 * | 5/2019 | Wang | H01L 25/0652 257/774 |
| 2020/0118973 A1 * | 4/2020 | Wang | H01L 24/24 |
| 2020/0243450 A1 * | 7/2020 | Cho | H01L 23/49822 |

FOREIGN PATENT DOCUMENTS

| | | |
|---|---|---|
| TW | 201818514 A | 5/2018 |
| TW | 201826483 A | 7/2018 |

OTHER PUBLICATIONS

Taiwanese Office Action dated Aug. 19, 2022, issued in corresponding Taiwanese Patent Application No. 108127842.

* cited by examiner

I-I'

BRIDGE EMBEDDED INTERPOSER, AND PACKAGE SUBSTRATE AND SEMICONDUCTOR PACKAGE COMPRISING THE SAME

CROSS-REFERENCE TO RELATED APPLICATION(S)

This application claims benefit of priority to Korean Patent Application Nos. 10-2019-0009366 filed on Jan. 24, 2019 in the Korean Intellectual Property Office, and 10-2019-0040072 filed on Apr. 5, 2019 in the Korean Intellectual Property Office, the disclosures of which are incorporated herein by reference in their entirety.

TECHNICAL FIELD

The present disclosure relates to a bridge embedded interposer, as well as a package substrate and a semiconductor package comprising the same.

BACKGROUND

An interposer market has grown in accordance with improvements in the specifications of high-end sets and the use of a high bandwidth memory (HBM). Currently, silicon has been commonly used as a material of an interposer. For example, in a case of a semiconductor package using an interposer, a die may be surface-mounted on a silicon-based interposer, and has been manufactured by molding with a molding material.

Meanwhile, since the number of HBM is increased due to recent improvements of specifications of sets, as compared to existing ones, an interposer has been implemented with high performance, which causes process difficulty to increase, and a yield to be lowered to become a high risk.

SUMMARY

An aspect of the present disclosure is to provide an interposer, and a package substrate and a semiconductor package including the same, capable of lowering process difficulty, improving process efficiency and yield, solving a warpage problem, complementing and improving power characteristics, and reducing the size, and also being manufactured in a large area.

An aspect of the present disclosure is to embed a bridge in an interposer using a frame including one or more wiring layers, and to electrically connect a connection structure including one or more redistribution layers.

According to an aspect of the present disclosure, a bridge embedded interposer may include: a connection structure including one or more redistribution layers; a first bridge disposed on the connection structure, and including one or more first circuit layers electrically connected to the one or more redistribution layers; a frame disposed around the first bridge on the connection structure, and including one or more wiring layers electrically connected to the one or more redistribution layers; and an encapsulant disposed on the connection structure, and covering at least a portion of each of the first bridge and the frame.

In addition, a package substrate according to an example may include: a printed circuit board; and a bridge embedded interposer disposed on the printed circuit board. The bridge embedded interposer may include: a connection structure including one or more redistribution layers; a bridge disposed on the connection structure, and including one or more circuit layers electrically connected to one or more redistribution layers; a frame disposed around the bridge on the connection structure, and including one or more wiring layers electrically connected to the one or more redistribution layers; and an encapsulant disposed on the connection structure, and covering at least a portion of each of the bridge and the frame. The one or more circuit layers may be electrically connected through the one or more redistribution layers and the one or more wiring layers.

In addition, a semiconductor package according to an example may include: a bridge embedded interposer including a connection structure having a first side and a second side opposing the first side, and including one or more redistribution layers, a bridge disposed on the first side of the connection structure, and including one or more circuit layers electrically connected to the one or more redistribution layers, a frame disposed around the bridge of the first side of the connection structure, and including one or more wiring layers electrically connected to the one or more redistribution layers, and an encapsulant disposed on the first side of the connection structure and covering at least a portion of each of the bridge and the frame; a first semiconductor chip disposed on the second side of the connection structure and having a plurality of first connection pads electrically connected to the one or more redistribution layers; and a second semiconductor chip disposed on the second side of the connection structure and having a plurality of second connection pads electrically connected to the one or more redistribution layers. At least a portion of the plurality of first connection pads and at least a portion of the plurality of second connection pads may be electrically connected to each other through the one or more circuit layers.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
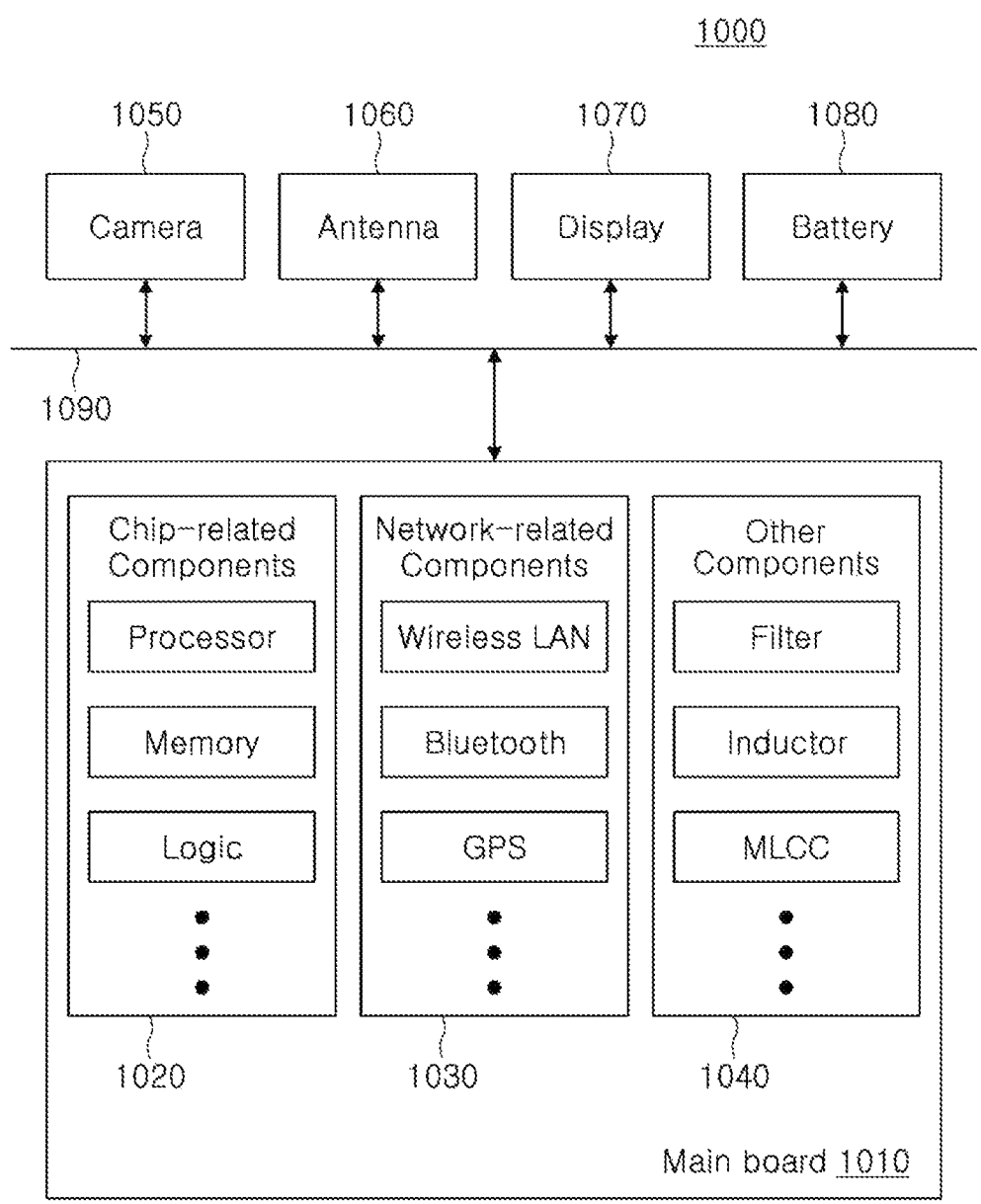
FIG. 1 is a schematic block diagram illustrating an example of an electronic device system.

Hereinafter, embodiments of the present disclosure will be described as follows with reference to the attached drawings. In the drawings, sizes and shapes of elements will be exaggerated or reduced for clear description.

Electronic Device

FIG. 1 is a schematic block diagram illustrating an example of an electronic device system.

Referring to FIG. 1, an electronic device 1000 may receive a motherboard 1010. The motherboard 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
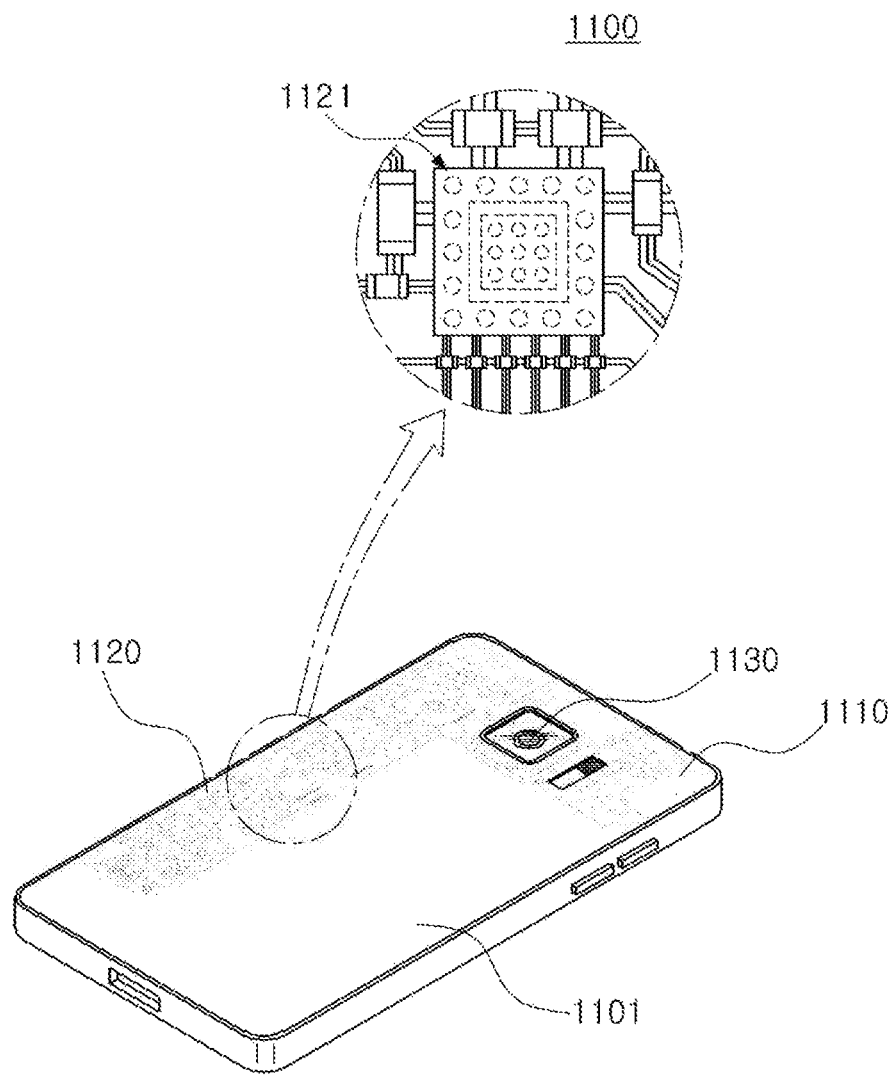
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically and/or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

Hereinafter, using an interposer of a semiconductor package manufactured by such a packaging technology will be described in more detail with reference to the drawings.

Figure 3:
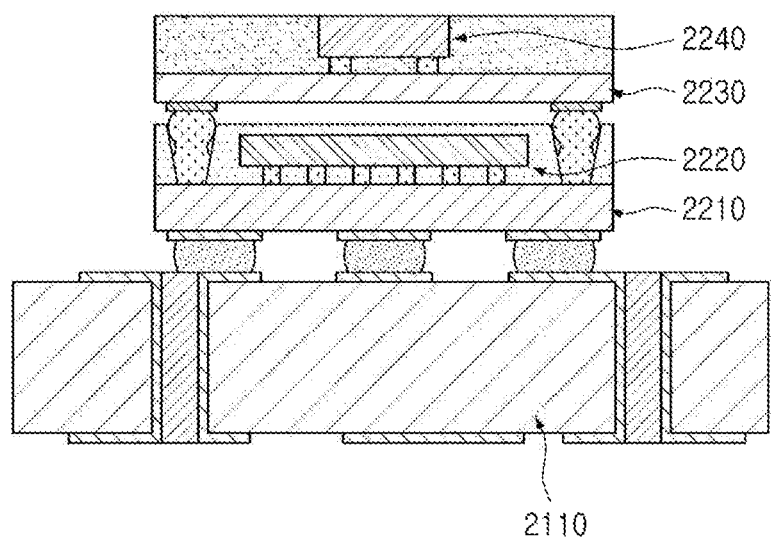
FIG. 3 is a schematic cross-sectional view illustrating a case in which a 3D ball grid array (BGA) package is mounted on a main board of an electronic device.

FIG. 3 is a schematic cross-sectional view illustrating a case in which a 3D ball grid array (BGA) package is mounted on a main board of an electronic device.

An application specific integrated circuit (ASIC) such as a graphics processing unit (GPU) among semiconductor chips is very expensive, and it is thus very important to perform packaging on the ASIC at a high yield. For this purpose, a ball grid array (BGA) substrate 2210, or the like, that may redistribute several thousands to several hundreds of thousands of connection pads is prepared before a semiconductor chip is mounted, and the semiconductor chip that is expensive, such as a GPU 2220, or the like, is mounted and packaged on the BGA substrate 2210 by surface mounting technology (SMT), or the like, and is then mounted finally on a main board 2110.

Meanwhile, in a case of the GPU 2220, it is required to significantly reduce a signal path between the GPU 2220 and a memory such as a high bandwidth memory (HBM). To this end, a product in which a semiconductor chip such as the HBM 2240 is mounted and then packaged on an interposer 2230, and is then stacked on a package in which the GPU 2220 is mounted, in a package-on-package (POP) form is used. However, in this case, a thickness of a device is excessive increased, and there is a limitation in significantly reducing the signal path.

Figure 4:
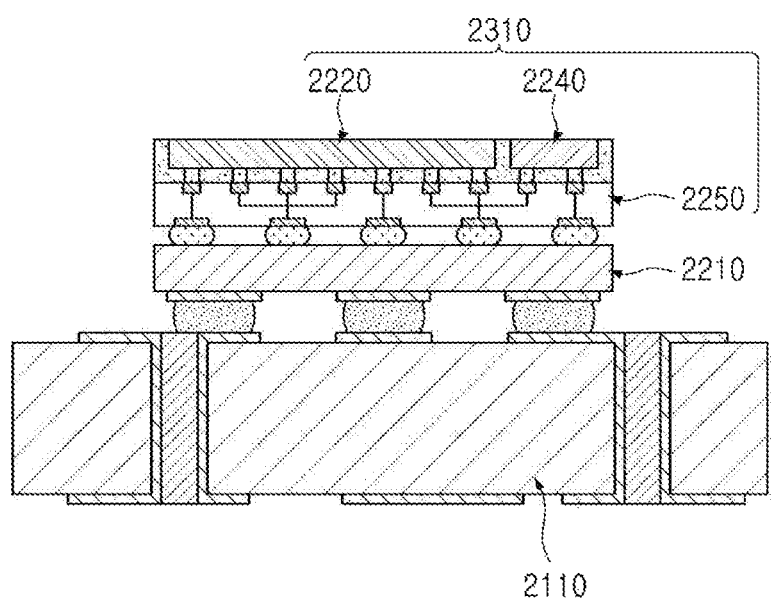
FIG. 4 is a schematic cross-sectional view illustrating a case in which a 2.5D silicon interposer package is mounted on a main board.

FIG. 4 is a schematic cross-sectional view illustrating a case in which a 2.5D silicon interposer package is mounted on a main board.

As a method for solving the problem described above, it may be considered to manufacture a semiconductor package 2310 including an organic interposer by 2.5D interposer technology of surface-mounting and then packaging a first semiconductor chip such as a GPU 2220 and a second semiconductor chip such as an HBM 2240 side-by-side with each other on an silicon interposer 2250. In this case, the GPU 2220 and the HBM 2240 having several thousands to several hundreds of thousands of connection pads may be redistributed by the silicon interposer 2250, and may be electrically connected to each other by the shortest path. In addition, when the semiconductor package 2310 including the silicon interposer is again mounted and redistributed on a BGA substrate 2210, or the like, it may be finally mounted on a main board 2110. However, it is very difficult to form through-silicon vias (TSVs) in the silicon interposer 2250, and a cost required for manufacturing the silicon interposer 2250 is significantly high, and the silicon interposer 2250 is thus disadvantageous in increasing an area and reducing a cost.

Figure 5:
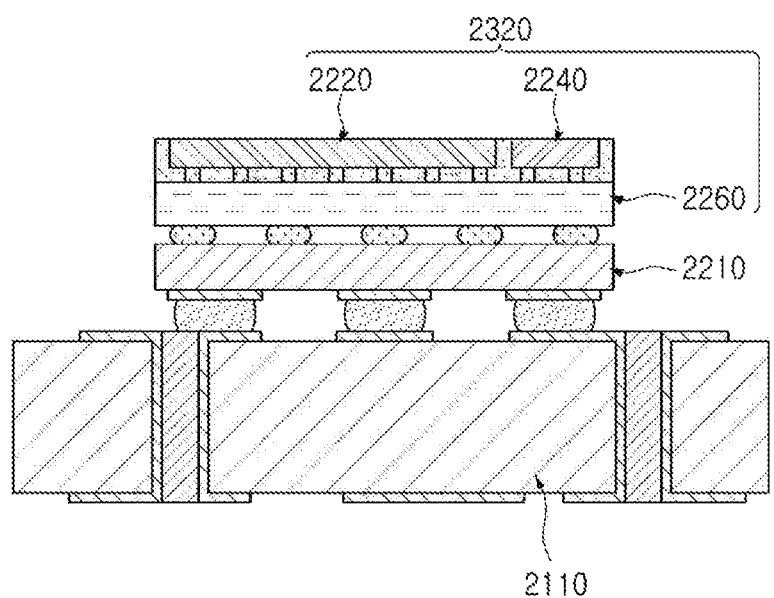
FIG. 5 is a schematic cross-sectional view illustrating a case in which a 2.5D organic interposer package is mounted on a main board.

FIG. 5 is a schematic cross-sectional view illustrating a case in which a 2.5D organic interposer package is mounted on a main board.

As a method for solving the problem described above, it may be considered to use an organic interposer 2260 instead of the silicon interposer 2250. For example, it may be considered to manufacture a semiconductor package 2320 including an organic interposer by a 2.5D interposer technology of surface-mounting and then packaging a first semiconductor chip such as a GPU 2220 and a second semiconductor chip such as an HBM 2240 side-by-side with each other on the organic interposer 2260. In this case, the GPU 2220 and the HBM 2240 having several thousands to several hundreds of thousands of connection pads may be redistributed by the organic interposer 2260, and may be electrically connected to each other by the shortest path. In addition, when the semiconductor package 2320 including an organic interposer is again mounted and redistributed on a BGA substrate 2210, or the like, it may be finally mounted on a main board 2110. In addition, the organic interposer may be advantageous in increasing an area and reducing a cost. However, in the case of the semiconductor package including the organic interposer, when a molding process is performed, warpage of the package may occur, fillability of an underfill resin may be deteriorated, and a crack between a die and a molding material may occur, due to mismatch between coefficients of thermal expansion (CTEs) of the interposer 2260 and the molding material of the semiconductor chips 2220 and 2240, as described above. In addition, an organic interposer may be disadvantageous in realizing a fine pattern.

As a method for solving the problem described above, though it is not illustrated in detail in the drawings, a silicon-based interconnection bridge having a fine pattern may be separately formed, and inserted into a cavity of the BGA substrate to be embedded. However, in this case, in this case, it is difficult to form the cavity and to realize the corresponding fine pattern in the BGA substrate, which may cause a problem of process and yield reductions. Therefore, a new-type of semiconductor package which may solve all the problems as described above has been required.

Figure 6:
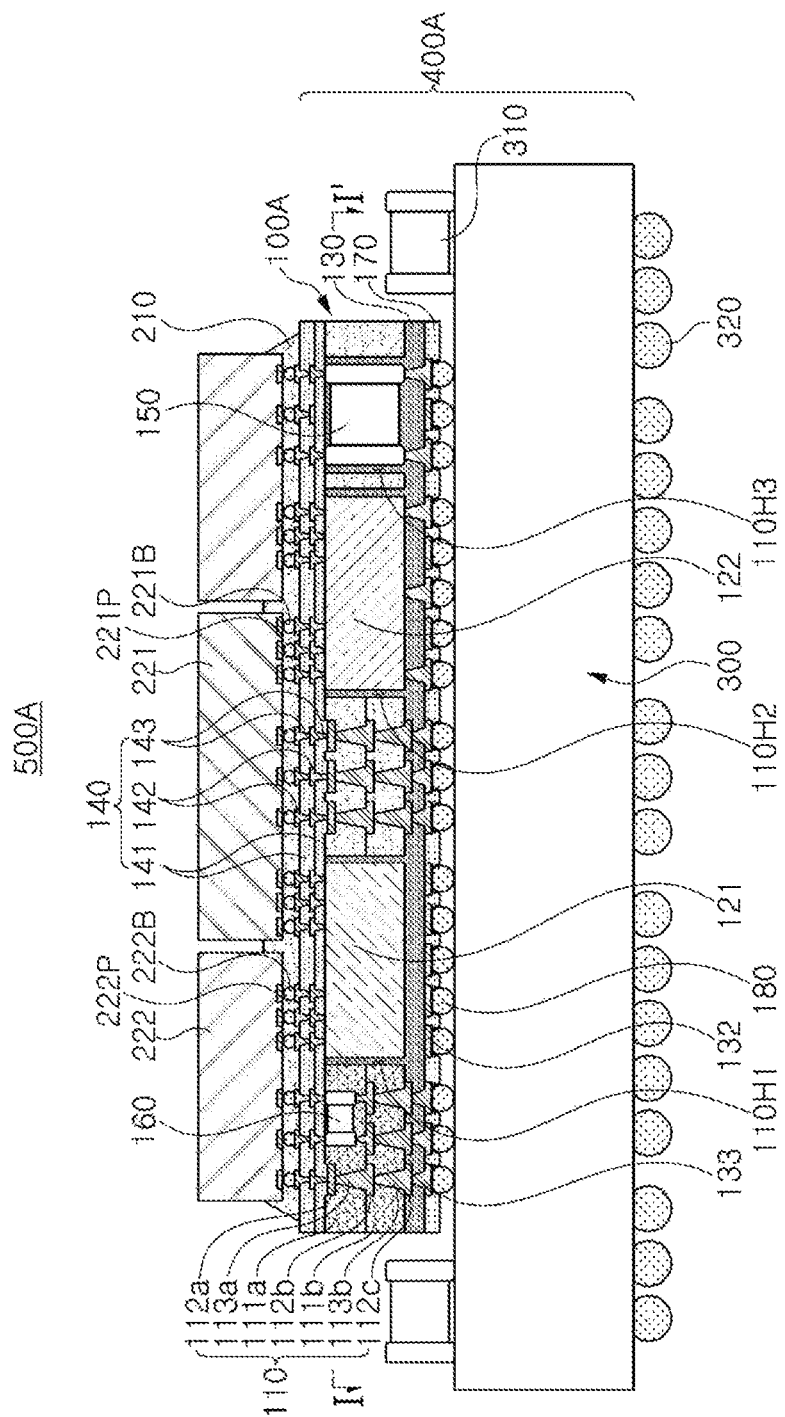
FIG. 6 is a schematic cross-sectional view illustrating an example of a semiconductor package.

FIG. 6 is a schematic cross-sectional view illustrating an example of a semiconductor package.

Figure 7:
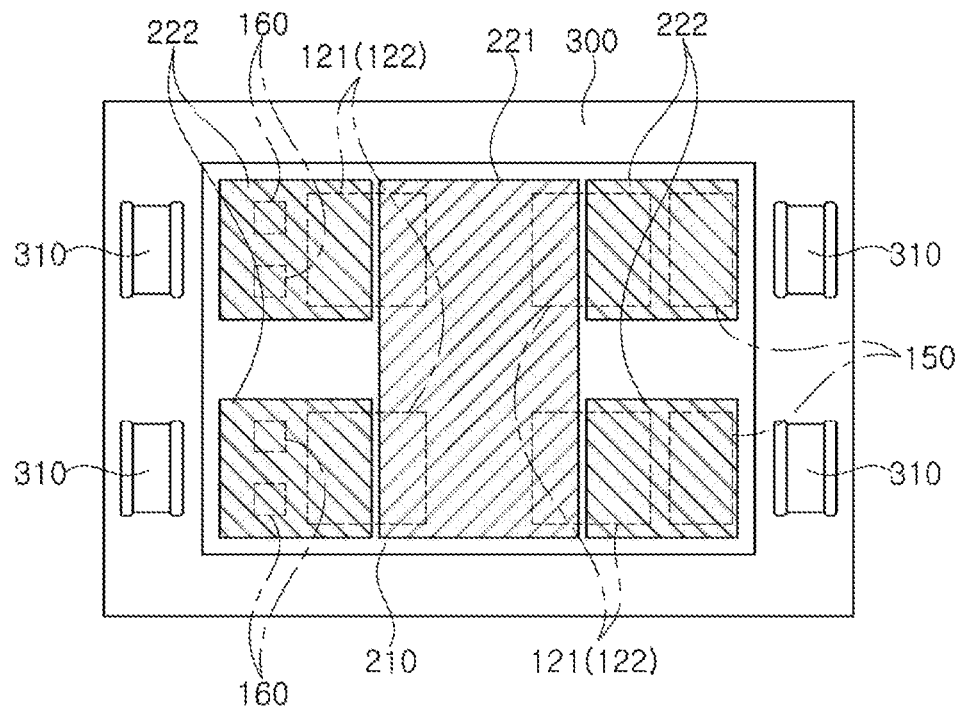
FIG. 7 is a schematic plan view of a top view of the semiconductor package of FIG. 6.

FIG. 7 is a schematic plan view illustrating a top view of the semiconductor package of FIG. 6.

Figure 8:
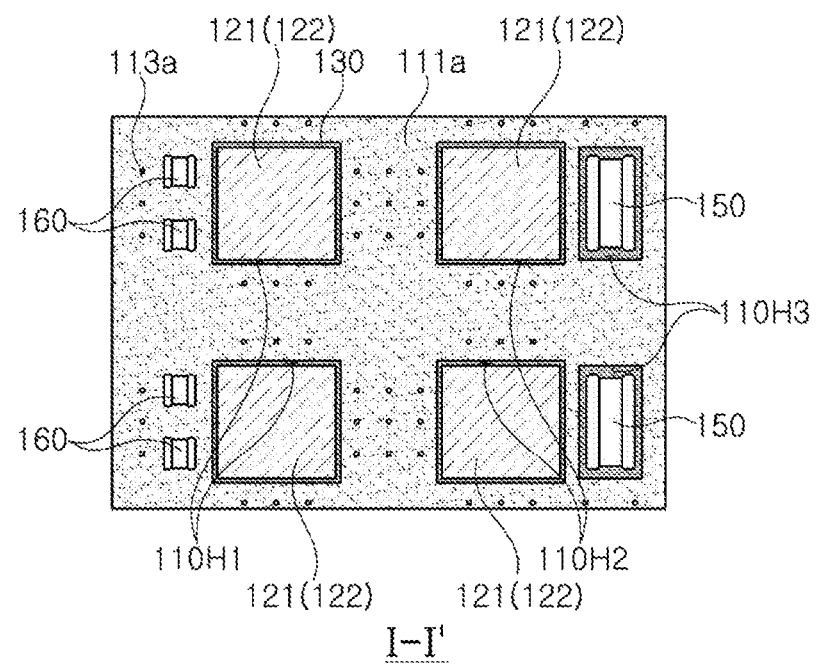
FIG. 8 is a schematic plan view taken along line I-I' of the semiconductor package of FIG. 6.

FIG. 8 is a schematic plan view taken along line I-I' of the semiconductor package of FIG. 6.

Referring to the drawings, a semiconductor package 500A according to an example may include a package substrate 400A including a printed circuit board 300 and a bridge embedded interposer 100A disposed on the printed circuit board 300. In addition, the semiconductor package 500A may include a first semiconductor chip 221 disposed on the bridge embedded interposer 100A and including a plurality of first connection pads 221P and a plurality of second semiconductor chips 222 disposed on the bridge embedded interposer 100A, respectively, and including a plurality of second connection pads 222P, respectively.

In this case, the bridge embedded interposer 100A according to an example may include a connection structure 140 having a first side and a second side opposing the first side, a plurality of first bridges 121 disposed on the first side of the connection structure 140, respectively, a plurality of second bridges 122 disposed on the first side of the connection structure 140, respectively, a frame 110 disposed around the plurality of first and second bridges 121 and 122 on the first side of the connection structure 140, and an encapsulant 130 disposed on the first side of the connection structure 140 and covering at least a portion of each of the plurality of first and second bridges 121 and 122 and the frame 110. The connection structure 140 may include one or more redistribution layers 142. Each of the plurality of first and second bridges 121 and 122 may be electrically connected to one or more redistribution layers 142, respectively. The frame 110 may include one or more wiring layers 112a, 112b, and 112c electrically connected to one or more redistribution layers 142. Meanwhile, the plurality of first connection pads 221P of the first semiconductor chip 221 and the plurality of second connection pads 222P of each of the second semiconductor chip 222 may be electrically connected to each other in various relationships through the plurality of first and second bridges 121 and 122, as illustrated in FIGS. 7 and 8. For example, the second pads 222P of each of the second semiconductor chip 222 may be electrically connected to the first connection pads 221P of the first semiconductor chip 221 through the first bridge 121 or the second bridge 122, respectively.

As described above, in the semiconductor package 500A according to an example, the bridge embedded interposer 100A according to an example may include the frame 110, and the plurality of first and second bridges 121 and 122 may be disposed using the frame 110. Specifically, in an example, the frame 110 may have a plurality of first through-portions 110H1 and a plurality of second through-portions 110H2, a plurality of first bridges 121 may be disposed in a plurality of first through-portions 110H1, respectively, and a plurality of second bridges 122 may be disposed in a plurality of second through-portions 110H2, respectively. After this disposition, the plurality of first and second bridges 121 and 122 may be encapsulated by the encapsulant 130, respectively. In this case, the only good products among the plurality of first and second bridges, separately manufactured, may be selected and disposed. In addition, the bridge embedded interposer 100A of the good products manufactured described above may be connected to a printed circuit board 300, a first semiconductor chip 221, and a plurality of second semiconductor chips 222 without a separate carrier, such that losses of the expensive first and second semiconductor chips 221 and 222 and the expensive printed circuit board 300 may be reduced. In addition, since the plurality of first and second bridges 121 and 122 may be manufactured in a compact size, a size of an ultrafine wiring region may be reduced, and an interposer yield may be prevented from being lowered. In addition, since the printed circuit board 300, the first semiconductor chip 221, and the plurality of second semiconductor chips 222 may be connected without the separate carrier as described above, a process may be simplified. Further, the frame 110 controls a process warpage, such that warpage control is also possible.

Meanwhile, the bridge embedded interposer 100A according to an example may further include a first passive component 150 and/or a second passive component 160. Specifically, in an example, the first passive component 150 may be disposed in a third through-portion 110H3 of the frame 110. In addition, the second passive component 160, smaller in size than the first passive component 150, may be embedded in the frame 110. The first and second passive components 150 and 160 may be known passive components such as capacitors or inductors, respectively. As described above, when the first and second passive components 150 and 160 are disposed at various positions in the bridge embedded interposer 100A, an electrical path to the first and/or second semiconductor chips is shorter than that of a third passive component 310 disposed on the printed circuit board 300, such that power integrity may be complemented and improved.

Meanwhile, the bridge embedded interposer 100A according to an example may further include a backside wiring layer 132 disposed on an opposite side of a side in which the connection structure 140 of the encapsulant 130 is disposed and a backside via 133 penetrating the encapsulant 130 and electrically connecting one or more wiring layers 112a, 112b, and 112c of the frame 110 and the backside wiring layer 132. In this case, a pad for a first electrical connection bump 180 may be disposed at various positions through a backside wiring design. Therefore, by improving the number of the first electrical connection bump 180, the electrical path to the printed circuit board 300 may be improved. The backside wiring layer 132 may be disposed on an opposite side of the side in which the connection structure 140 of the encapsulant 130 is disposed and may be protected by a passivation layer 170 covering at least a portion of the backside wiring layer 132.

The passivation layer 170 may have an opening exposing at least a portion of each of the backside wiring layer 132, and the first electrical connection bump 180 may be disposed in the opening, respectively, to be electrically connected to the exposed backside wiring layer 132.

Hereinafter, each configuration included in the semiconductor package 500A according to an example will be described in more detail with reference to the drawings.

First, the bridge embedded interposer 100A according to an example may include a frame 110, a plurality of first bridges 121, a plurality of second bridges 122, an encapsulant 130, and a connection structure 140, as described above. In addition, if needed, the bridge embedded interposer 100A may further include a first passive component 150 and/or a second passive component 160. In addition, if needed, the bridge embedded interposer 100A may further include a backside wiring layer 132, a backside via 133, and/or a first electrical connection bump 180.

The frame 110 may improve rigidity of the bridge embedded interposer 100A depending on certain materials, and serve to secure uniformity of a thickness of the encapsulant 130. The frame 110 may have first to third through-portions 110H1 110H2, and 110H3 penetrating the first and second insulating layers 111a and 111b. The frame 110 may include first to third wiring layers 112a, 112b, and 112c and first and second wiring vias 113a and 113b in addition to the first and second insulating layers 111a and 111b. Therefore, the frame 110 may function as an electrical connection member providing a vertical electrical connection path. If needed, the frame 110 may be composed of a plurality of frame units. Each frame unit may include the first and second insulating layers 111a and 111b, the first to third wiring layers 112a, 112b, and 112c, and the first and second wiring vias 113 and 113b, independently. Each frame unit may be disposed around the plurality of first and second bridges 121 and 122.

The first bridge 121, the second bridge 122, and/or the first passive component 150 may be disposed in the first to third through-portions 110H1, 110H2, and 110H3 of the frame 110, respectively, according to designs. For example, the first bridge 121 may be disposed in the first through-portion 110H1, respectively. However, the present disclosure is not limited thereto, and a plurality of first bridges 121 may be disposed together in one first through-hole 110H1. The second through-hole 110H2 and the second bridge 122 are also the same. The second bridge 122 may be disposed in the first through-hole 110H1 instead of the first bridge 121. The first bridge 121 may be disposed in the second through-portion 110H2 instead of the second bridge 122. The first passive component 130 may be disposed in the third through-portion 110H2, respectively, or the plurality of first passive components 150 may be disposed in the third through-portion 110H3. The first and second bridges 121 and 122 and the first passive component 150 may be disposed in the first to third through-portions 110H1, 110H2, and 110H3, respectively, and may be continuously surrounded by an inner side wall of the frame 110, but is not limited thereto. For example, the frame 110, itself may include a plurality of unit frames, and in this case, the frame 110 may be surrounded discontinuously.

The frame 110 may include a first insulating layer 111a, in contact with the first side of the connection structure 140, a first wiring layer 112a, in contact with the first side of the connection structure 140, and embedded in the first insulating layer 111a, a second wiring layer 112b disposed on an opposite side of a side in which the first wiring layer 112a is embedded, a second insulating layer 111b disposed on the first insulating layer 111a and covering at least a portion of the second wiring layer 112b, and a third wiring layer 112c disposed on an opposite side of a side in which the second wiring layer 112b is embedded. The first and second wiring layers 112a and 112b and the second and third wiring layers 112b and 112c may be electrically connected through first and second wiring vias 113a and 113b penetrating the first and second insulating layers 111a and 111b, respectively. The first to third wiring layers 112a, 112b, and 112c may be electrically connected to the first and second bridges 121 and 122 through the redistribution layer 142 of the connection structure 140 and a connection via 143.

A material of the first and second insulating layers 111a and 111b is not particularly limited, and for example, an insulating material may be used as the material of the first and second insulating layers. In this case, the insulating material may be a thermosetting resin such as an epoxy resin, a thermoplastic resin such as a polyimide resin, a resin in which the thermosetting resin and the thermoplastic resin are mixed with an inorganic filler, for example, Ajinomoto build-up film (ABF), or the like, may be used as the insulating material. Alternatively, a resin in which a thermosetting resin or a thermoplastic resin is impregnated together with an inorganic filler in a core material such as a glass fiber (or a glass cloth or a glass fabric), for example, prepreg, or the like, may also be used as the insulating material.

The first to third redistribution layers 112a, 112b, and 112c may provide a vertical electrical connection path of the bridge embedded interposer 100A together with the first and second wiring vias 113a and 113b. A formation material of the first to third wiring layers 112a, 112b, and 112c may be a metal material such as copper (Cu), aluminum (Al), silver (Ag), tin (Sn), gold (Au), nickel (Ni), lead (Pb), titanium (Ti), or alloys thereof. The first to third redistribution layers 112a, 112b, and 112c may perform various functions depending on designs of corresponding layers. For example, the first to third wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. The ground (GND) patterns and the power (PWR) patterns may be the same patterns. In addition, the first to third wiring layers 112a, 112b, and 112c may include various types of via pads, and the like, respectively.

Thicknesses of each of the first to third wiring layers 112a, 112b, and 112c may be thicker than the thickness of each of the redistribution layer 142. Specifically, since the frame 110 selects the material of the first and second insulating layers 111a and 111b as prepreg, or the like to maintain rigidity, the thicknesses of the first to third wiring layers 112a, 112b, and 112c formed thereon may be relatively thick. On the other hand, the connection structure 140 may be required to have a fine circuit and a high-density design. Therefore, since a photosensitive insulating material (PID), or the like is used as the material of the insulating layer 141, the thickness of the redistribution layer 142 formed thereon may be relatively thin.

The first wiring layer 112a may be recessed inwardly of the first insulating layer 111a. In this case, the first wiring layer 112a may be recessed inwardly of the first insulating layer 111a such that a first surface of the first insulating layer 111a in contact with the first side of the connection structure 140 and a surface of the first wiring layer 112a in contact with the first side of the connection structure 140 may have a step. Therefore, when the frame 110 and the first and second bridges 121 and 122 are covered with the encapsulant 130, a formation material of the first wiring layer 112a of the frame 110 may be prevented from being contaminated by bleeding a formation material of the encapsulant 130.

The first and second wiring vias 113a and 113b may electrically connect the first to third wiring layers 112a, 112b, and 112c, formed on different layers, from each other, resulting in an electrical path in the frame 110. A formation material of the first and second wiring vias 113a and 113b may be a metal material such as copper (Cu), aluminum (Al), silver (Ag), tin (Sn), gold (Au), nickel (Ni), lead (Pb), titanium (Ti), or alloys thereof. The first and second wiring vias 113a and 113b may include a signal via, a power via, a ground via, and the like. The power via and the ground via may be the same vias. The first and second wiring vias 113a and 113b may be a field-type via, filled with a metal material, respectively, or a conformal-type via, in which a metal material is formed along a wall surface of a via hole. In addition, the first and second wiring vias 113 and 113b may have tapered shapes, respectively.

When a hole for the first wiring via 113a is formed, some pads of the first wiring layer 112a may serve as a stopper. In this regard, it may be advantageous in a process in that the first wiring via 113a has a tapered shape in which a width of an upper surface is smaller than a width of a lower surface. In this case, the first wiring via 113a may be integrated with a pad pattern of the second wiring layer 112b. In addition, when a hole for the second wiring via 113b is formed, some pads of the second wiring layer 112b may serve as a stopper. In this regard, it may be advantageous in a process in that the second wiring via 113b has a tapered shape in which a width of an upper surface is smaller than a width of a lower surface. In this case, the second wiring via 113b may be integrated with a pad pattern of the third wiring layer 112c.

The first and second bridges 121 and 122 may include fine circuit wirings for electrically interconnecting first and second connection pads 221P and 222P of the first and second semiconductor chips 221 and 222, respectively. To this end, the first and second bridges 121 and 122 may be disposed such that at least a portion of thereof overlap the first and second semiconductor chips 221 and 222, respectively, as illustrated in FIGS. 7 and 8. Since the first and second bridges 121 and 122 include fine circuit wirings, circuits (not shown) inside the first and second bridges 121 and 122 may be thinner than the thickness of the redistribution layer 142 of the connection structure 140. In addition, circuits (not shown) may be vertically electrically connected through vias (not shown) having a pitch, smaller than a pitch between the connection via 143 of the connection structure 140. The first and second bridges 121 and 122 may be a Si interconnect bridge, a glass interconnect bridge, a ceramic interconnect bridge, or an organic interconnect bridge, but is not limited thereto. Unlike the first bridge 121, the second bridge 122 may be additionally provided with a design for vertical electrical connection therein. For example, when the second bridge 122 is a silicon interconnect bridge, a through silicon via (TSV) may be further formed, compared to the first bridge 121.

The encapsulant 130 may cover at least a portion of each of the frame 110 and the first and second bridges 121 and 122. In addition, the encapsulant 130 may fill at least a portion of each of the first to third through-portions 110H1, 110H2, and 110H3. The encapsulant 130 may include an insulating material. In this case, the insulating material may be a non-photosensitive insulating material, more specifically, a non-photosensitive material including an inorganic filler and an insulating resin. For example, the insulating material may be a thermosetting resin such as an epoxy resin, a thermoplastic resin such as a polyimide resin, or a resin in which a reinforcement such as an inorganic filler is contained in the thermosetting resin or the thermoplastic resin, in detail, a non-photosensitive insulating material such as Ajinomoto build-up film (ABF) and epoxy molding compound (EMC). If necessary, a material in which an insulating resin such as the thermosetting resin or the thermoplastic resin are impregnated together with an organic filler in a glass fiber, or the like, for example, prepreg, or the like may be used. Through this, it is possible to improve void and undulation problem, and warpage control may be made easier.

The connection structure 140 may redistribute the first and second connection pads 221P and 222P of each of the first and second semiconductor chips 221 and 222. In addition, the first and second connection pads 221P and 222P of each of the first and second semiconductor chips 221 and 222 may be electrically connected to the first and/or second bridges 121 and 122 according to the disposition. The connection structure 140 may include an insulating layer 141, a redistribution layer 142 disposed on the insulating layer 141, and a connection via 143 connected to the redistribution layer 142 penetrating the insulating layer 141. The connection via 143 may electrically connect the redistribution layers 142, disposed on different layers, to each other. In addition, the connection structure 140 may electrically connect the redistribution layer 142 to the first and/or second bridges 121 and 122 or the first to third wiring layers 112a, 112b, and 112c of the frame 110. The insulating layer 141, the redistribution layer 142, and the connection via 143 of the connection structure 140 may be greater or smaller than those illustrated in the drawings, respectively.

A material of the insulating layer 141 may be an insulating material. In this case, a photosensitive insulating material (PID) may be used as the insulating material. In this case, it is possible to introduce a fine pitch through a photo via, which is advantageous for a fine circuit and a high density design. When the insulating layer 141 has multiple layers, boundaries may be separated from each other, and boundaries therebetween may also not be apparent.

The redistribution layer 142 may perform a substantial redistribution function. An insulating material of the redistribution layer 142 may also be a metal material such as copper (Cu), aluminum (Al), silver (Ag), tin (Sn), gold (Au), nickel (Ni), lead (Pb), titanium (Ti), or alloys thereof. The redistribution layer 142 may also perform various functions depending on designs. The ground (GND) patterns and the power (PWR) patterns may be the same patterns. In addition, the redistribution layer 142 may include various types of via pads, electrical connection metal pads, and the like.

The connection via 143 may electrically connect the redistribution layers 142, and the like, formed on different layers to each other. In addition, the connection via 143 may electrically connect the redistribution layers 132 to the first and/or second bridges 121 and 122 or the first to third wiring layers 112a, 112b, and 112c of the frame 110. The connection via 143 may include a signal via, a power via, a ground via, and the like, and the power via and the ground via may be the same vias. The connection via 143 may also be a field-type via filled with a metal material, respectively, or a conformal-type via in which a metal material is formed along a wall surface of a via hole. In addition, the connection via 143 may have a tapered shape inverse with regard to the first and second wiring vias 113a and 113b.

The first and second passive components 150 and 160 may independently be an inductor such as a high frequency inductor, a ferrite inductor, a power inductor, and the like, respectively, may be a capacitor, or the like, such as LTCC and MLCC, and a ferrite bead, an EMI filter, or the like. The first passive component 140 may be disposed in the third through-portion 110H3 and the second passive component 160 may be disposed inside the frame 110. The first passive component 150 may have a size, greater than that of the second passive component 160. For example, the first passive component 150 may be thicker than the second passive component 160, and may have a greater mounting area.

A backside wiring layer 132 may be introduced for backside wiring designs. A material of the backside wiring layer 132 may also be a metal material such as copper (Cu), aluminum (Al), silver (Ag), tin (Sn), gold (Au), nickel (Ni), lead (Pb), titanium (Ti), or alloys thereof. The backside wiring layer 132 may also perform various functions depending on designs. For example, the backside wiring layer 132 may include ground (GND) pattern pads, power (PWR) pattern pads, signal(S) pattern pads, and the like. The ground (GND) pattern pads and the power (PWR) pattern pads may have the same patterns. The backside wiring layer 132 may be disposed in a uniform distribution over an entire area of the lower surface of the encapsulant 130, if required. When at least a portion of the backside wiring layer 132 is disposed so as to overlap with the first and/or second bridges 121 and 122, heat generated from the first and/or second bridges 121 and 122 may be more easily discharged through the first electrical connection bump 180, or the like.

The backside via 133 may provide an electrical connection path between the first to third wiring layers 112a, 112b, and 112c and the backside wiring layer 132. A formation material may be a metal material such as copper (Cu), aluminum (Al), silver (Ag), tin (Sn), gold (Au), nickel (Ni), lead (Pb), titanium (Ti), or alloys thereof. The backside via 133 may be a field-type via filled with a metal material, or a conformal-type via in which a metal material is formed along a wall surface of a via hole. In addition, the backside via 133 may have the same tapered shape as that of the first and second wiring vias 113a and 113b. The backside via 133 may also include signal vias, ground vias, power vias, and the like, and the power vias and the ground vias may be the same vias.

The passivation layer 170 may protect the backside wiring layer from external physical or chemical damages, with an additional configuration. The passivation layer 170 may include a thermosetting resin. For example, the passivation layer 170 may be ABF, but is not limited thereto. The passivation layer 170 may have an opening exposing at least a portion of the backside wiring layer 132. The number of openings may be several tens to several thousands, and may be provided in a greater or lesser number. Each of the openings may be composed of a plurality of holes. If needed, a surface mounting component (not shown) such as a land side capacitor (LSC) may be disposed on the lower surface of the passivation layer 170.

The first electrical connection bump 180 may physically and/or electrically connect the bridge embedded interposer 100A to the printed circuit board 300. The first electrical connection bump 180 may be disposed on the openings of the passivation layer 170 and may be electrically connected to the backside wiring layer 132, respectively. The first electrical connection bump 180 may be formed of a low-melting point metal, for example, tin (Sn) or an alloy including tin (Sn), respectively. More specifically, the first electrical connection bump 180 may be formed of a solder, or the like. However, this is only an example, a material of the first electrical connection bump 180 is not particularly limited thereto. The first electrical connection bump 180 may be a land, a ball, a pin, or the like. The first electrical connection bump 180 may be formed of multiple layers or a single layer. When the first electrical connection bump 180 includes the plurality of layers, the first electrical connection bump 180 may include a copper pillar and a solder. When the first electrical connection bump 180 includes the single layer, the first electrical connection bump 180 may include a tin-silver solder or copper, but this is only an example, and the present disclosure is not limited thereto. The number, an interval, a dispositional form, and the like of the first electrical connection bump 180 are not particularly limited, but may be sufficiently modified depending on design specifications.

A package substrate 400A according to an example may include a printed circuit board 300 and a bridge embedded interposer 100A mounted on the printed circuit board 300 according to the above-described example. If necessary, a third passive component 310 may be mounted on the printed circuit board 300 around the bridge embedded interposer 100A according to an example. A passive component (not shown) may also be embedded inside the printed circuit board 300. The printed circuit board 300 may be mounted on a main board, or the like, of an electronic device through a second electrical connection bump 320, such as a solder ball, or the like. That is, the printed circuit board 300 may be a BGA substrate as described above, but is not limited thereto.

In a semiconductor package 500A according to an example, a first semiconductor chip 221 and a plurality of second semiconductor chips 222 may be disposed in parallel with each other on a second side of the bridge embedded interposer 100A according to an example. A plurality of first connection pads 221P of the first semiconductor chip 221 and a plurality of second connection pads 122P of each of the plurality of second semiconductor chips 222 may be electrically connected to one or more redistribution layers 142 of the connection structure 140 of the bridge embedded interposer 100A according to an example depending on functions, respectively. Specifically, the plurality of first connection pads 221P of the first semiconductor chip 221 may be electrically connected to a protruding pad of the one or more redistribution layers 142, respectively, through the plurality of first electrical connection metals 221B, respectively. Similarly, the plurality of second connection pads 222P of each of the plurality of second semiconductor chips 222 may be electrically connected to a protruding pad of the one or more redistribution layers 142 through the plurality of second electrical connection metals 222B, respectively. As a result, they may also be electrically connected to the plurality of first and second bridges 121 and 122 through the one or more redistribution layers 142. The first and second electrical connection metals 221B and 222B may be formed of a low melting point, respectively, for example, tin (Sn) or an alloy including tin (Sn). More specifically, the first and second electrical connection metals 221B and 222B may be formed of a solder, or the like, but is not limited thereto.

The first semiconductor chip 221 may be an integrated chip circuit (IC) provided in an amount of several hundred to several million or more elements integrated in a single chip. In this case, a base material of a body may be silicon (Si), germanium (Ge), gallium arsenide (GaAs), or the like. Various circuits may be formed on the body. The first connection pad 221P of the first semiconductor chip 221 may electrically connect the first semiconductor chip 221 to other components. A material of the first connection pad 221P may be a metal material such as copper (Cu), aluminum (A1), or the like, and the metal material may be used without any particular limitation. A passivation layer (not shown) exposing the first connection pad 221P may be formed on the body, and the passivation layer (not shown) may be an oxide layer, a nitride layer, or the like, or a double layer of an oxide layer and a nitride layer.

The second semiconductor chip 222 may be an integrated circuit (IC) provided in an amount of several hundred to several million or more elements integrated in a single chip. If necessary, the second semiconductor chip 222 may have a form in which the integrated circuits (ICs) are stacked. The stacked circuits (ICs) may also be electrically connected to other components through a through silicon via (TSV), or the like. The second semiconductor chip 222 may also have the second connection pad 122P for electrically connecting the second semiconductor chip 222 to other components, and in this case, the second connection pad 122P may be disposed on a lowermost side of the second semiconductor chip 222 facing the bridge embedded interposer 100A.

The first semiconductor chip 221 may be an application-specific integrated circuit (ASIC). Alternatively, the first semiconductor chip 221 may be a field programmable array (FPGA). Alternatively, the first semiconductor chip 221 may be a chip set of an application specific integrated circuit (ASIS) and a field programmable gate array (FPGA). Alternatively, the first semiconductor chip 221 may be a graphics processing unit (GPU). Alternatively, the first semiconductor chip 221 may be a chip set of an application-specific integrated circuit (ASIC), a field programmable gate array (FPGA), and a graphics processing unit (GPU). In addition, the second semiconductor chip 222 may be a stacked memory such as a high bandwidth memory (HBM), respectively. That is, the first and second semiconductor chips 221 and 222 may be expensive chips having several tens to several millions of or more of I/Os, but is not limited thereto. The second semiconductor chip 222 may be disposed in a larger number than the first semiconductor chip 221, and may be disposed around the first semiconductor chip 221. For example, as illustrated in FIG. 7, two second semiconductor chips 221 may be disposed on both sides of the first semiconductor chip 221, but is not limited thereto.

Meanwhile, in a semiconductor package 500A according to an example, an underfill resin 210 covering at least portions of a lower side of each of the first semiconductor chip 221 and the plurality of semiconductor chips 222 may be further disposed on a second side of the bridge embedded interposer 100A according to an example. The underfill resin 210 may fill a space between the first semiconductor chip 221 and each of the second semiconductor chips 222 and the second side of the bridge embedded interposer 100A according to an example. In addition, the underfill resin 210 may cover a plurality of first electrical connection metals 221B and a plurality of second electrical connection metals 222B. The first semiconductor chip 221 and the plurality of second semiconductor chips 222 may be fixed through the underfill resin 210. In addition, if necessary, on a second side of the bridge embedded interposer 100A according to an example, a molding material (not shown) covering at least a portion of each of the first semiconductor chip 221 and the plurality of second semiconductor chips 222 may be further disposed, and if necessary, the molding material (not shown) may expose one surface of each of the first semiconductor chip 221 and the plurality of second semiconductor chips 222 as a result of grinding.

Figure 9:
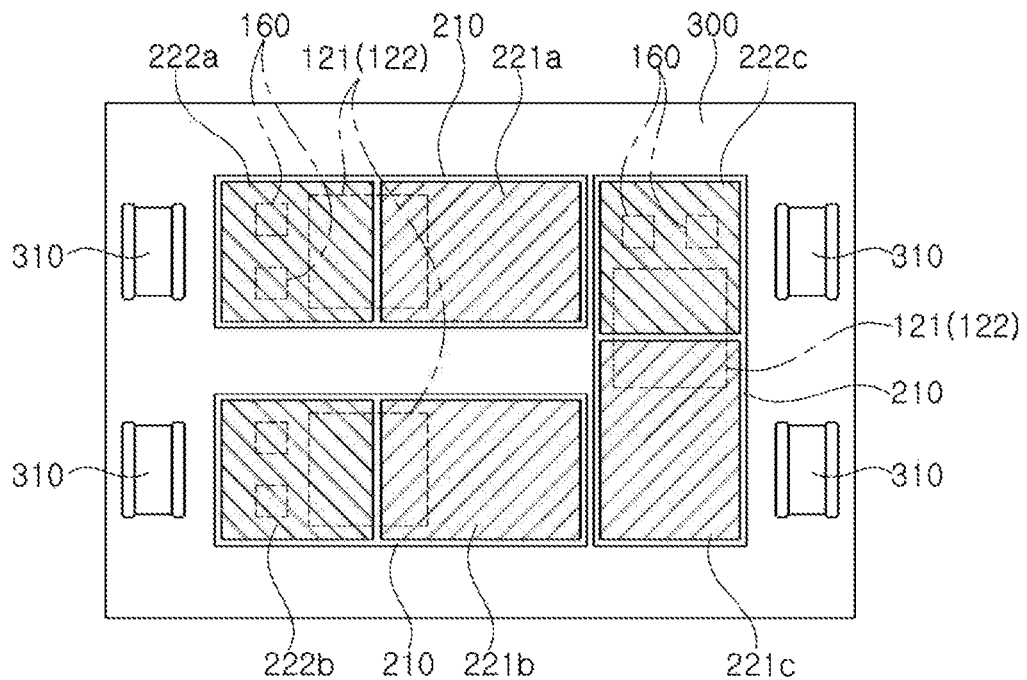
FIG. 9 is a schematic plan view illustrating a modification example of the top view of FIG. 7.

FIG. 9 is a schematic plan view illustrating a modification example of the top view of FIG. 7.

Figure 10:
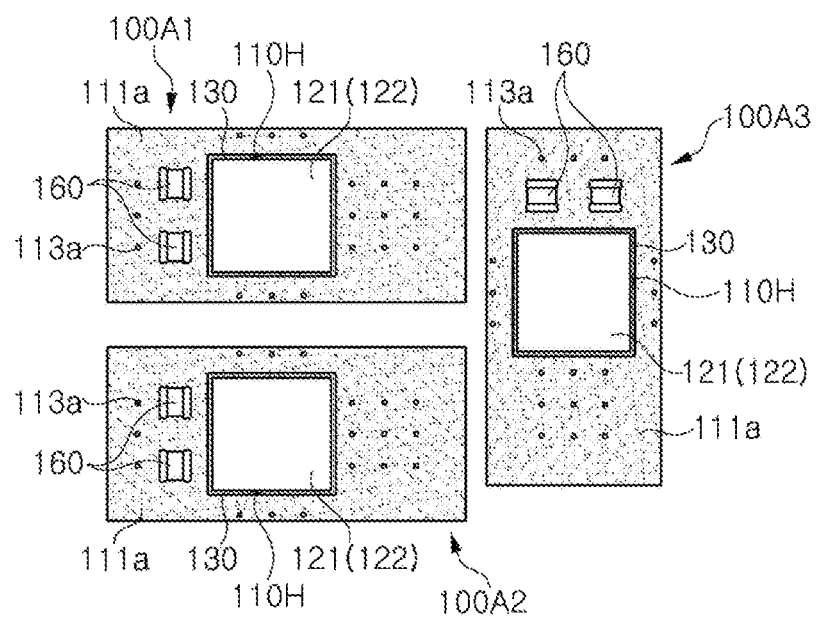
FIG. 10 is a schematic cut-away plan view illustrating a modification example of the cut-away plan view of FIG. 8.

FIG. 10 is a cut-away plan view illustrating a modification example of the cut-away plan view of FIG. 8.

Referring to FIGS. 9 and 10, a semiconductor package as a modification example may be one in which a plurality of bridge embedded interposers 100A1, 100A2, and 100A3 are independently disposed on a printed circuit board 300, respectively. For example, the first bridge embedded interposer 100A1 may include a first bridge 121 or a second bridge 122, and an electrical connection between a 1-1 semiconductor chip 221a and a 2-1 semiconductor chip 222a through this may be provided. Similarly, a second bridge embedded interposer 100A2 may provide an electrical connection between a 1-2 semiconductor chip 221b and a 2-2 semiconductor chip 222b. Similarly, a third bridge embedded interposer 100A3 may provide an electrical connection between a 1-3 semiconductor chip 221c and a 2-3 semiconductor chip 222c. Respective semiconductor chips 221a, 222a, 221b, 222b, 221c, and 222c may be different from each other. That is, various designs may be made through the plurality of bridge embedded interposers 100A1, 100A2, and 100A3. Other descriptions are substantially the same as those described above, and a detailed description thereof will be omitted.

Figure 11:
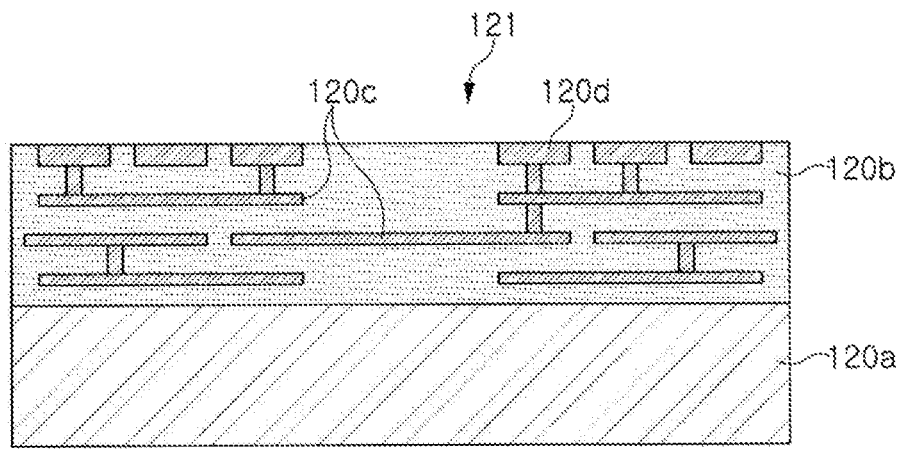
FIG. 11 is a schematic cross-sectional view illustrating an example of a first bridge of the semiconductor package of FIG. 6.

FIG. 11 is a schematic cross-sectional view illustrating an example of a first bridge of the semiconductor package of FIG. 6.

Referring to FIG. 11, a first bridge 121 according to an example may include a base layer 120a, an insulating layer 120b disposed on the base layer 120a, a circuit layer 120c disposed on the insulating layer 120b, and a pad layer 120d disposed on an upper side of the insulating layer 120b. The base layer 120a may control warpage, and may include silicon (Si), glass, ceramic, and the like, from this viewpoint. The insulating layer 120b may include an insulating material. The circuit layer 120c and the pad layer 120d may include a metal material. The circuit layer 120c may include a wiring part and a via part. The pad layer 120d may be connected to a connection via 143 of a connection structure 140. That is, the first bridge 121 according to an example may be a silicon interconnect bridge, a glass interconnect bridge, a ceramic interconnect bridge, or the like.

Figure 12:
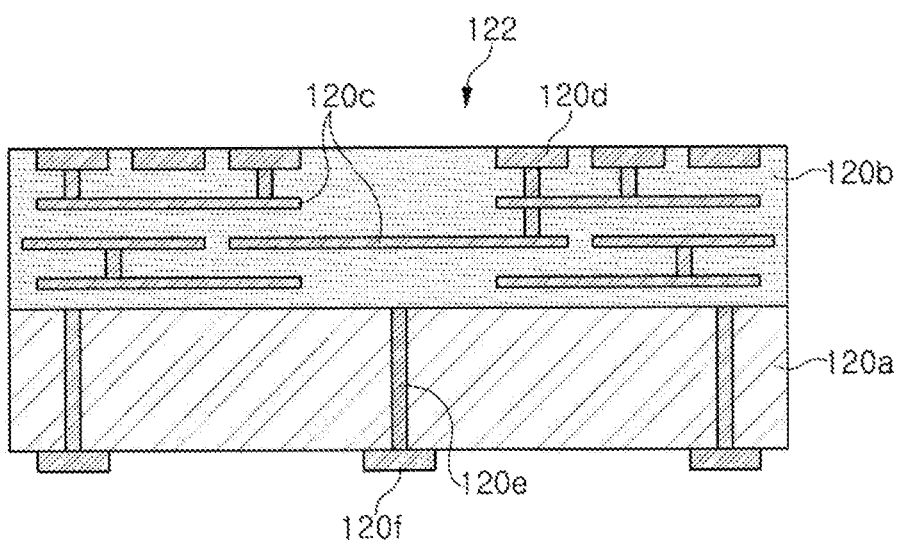
FIG. 12 is a schematic cross-sectional view illustrating an example of a second bridge of the semiconductor package of FIG. 6.

FIG. 12 is a schematic cross-sectional view illustrating an example of a second bridge of the semiconductor package of FIG. 6.

Referring to FIG. 12, a second bridge 122 according to an example may further include a through via 120e penetrating the base layer 120a and a pad layer 120f disposed on a lower side of the base layer 120a in the first bridge 122 according to the first bridge 121 according to the above-described example. The through via 120e and the pad layer 120f may also include a metal material. The pad layer 120f may be connected to a backside via. That is, the second bridge 122 according to an example may have pad layers 120d and 120f on both upper and lower sides thereof, and the second bridge 122 may be a silicon interconnect bridge, a glass interconnect bridge, a ceramic interconnect bridge, or the like, electrically connected to each other, through the through via 120e, or the like.

Figure 13:
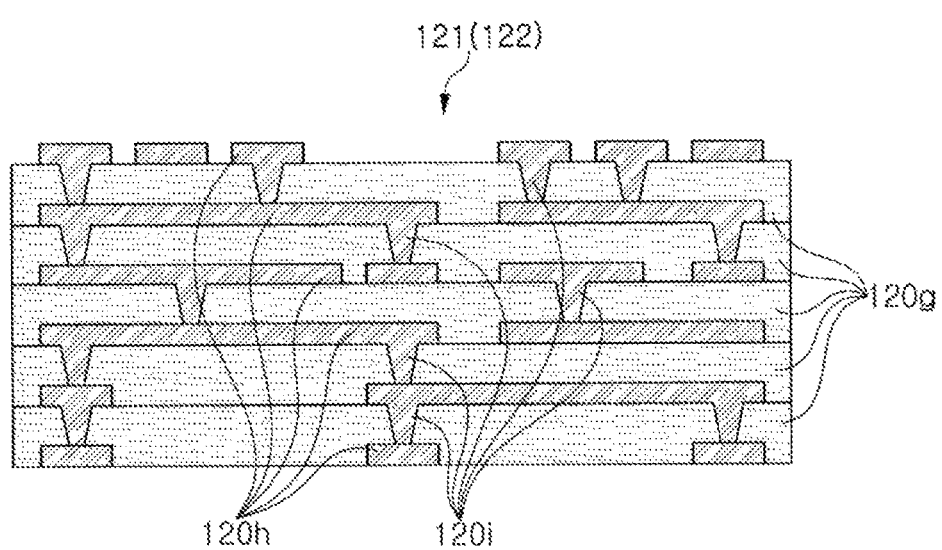
FIG. 13 is a schematic cross-sectional view illustrating another example of the first bridge and/or the second bridge of the semiconductor package of FIG. 6.

FIG. 13 is a schematic cross-sectional view illustrating another example of the first bridge and/or the second bridge of the semiconductor package of FIG. 6.

Referring to FIG. 13, the first bridge 121 and/or the second bridge 122 according to another example may include one or more insulating layers 120g, a pattern layer 120h disposed on or in the one or more insulating layers 120g, respectively, and one or more via layers 120i penetrating the one or more insulating layers 120g, respectively, and electrically connecting the pattern layers 120h, disposed at different levels, from each other. The pattern layer 120h and the via layer 120i may be used as a circuit layer. The uppermost and lowermost pattern layer 120h may be used as a pad layer, and may be connected to the connection via 143 and the backside via 133, respectively. That is, the first bridge 121 and/or according to another example may be an organic interconnect bridge.

FIGS. 14 to 17 are schematic process views illustrating a manufacturing example of the semiconductor package of FIG. 6.

Figure 14:
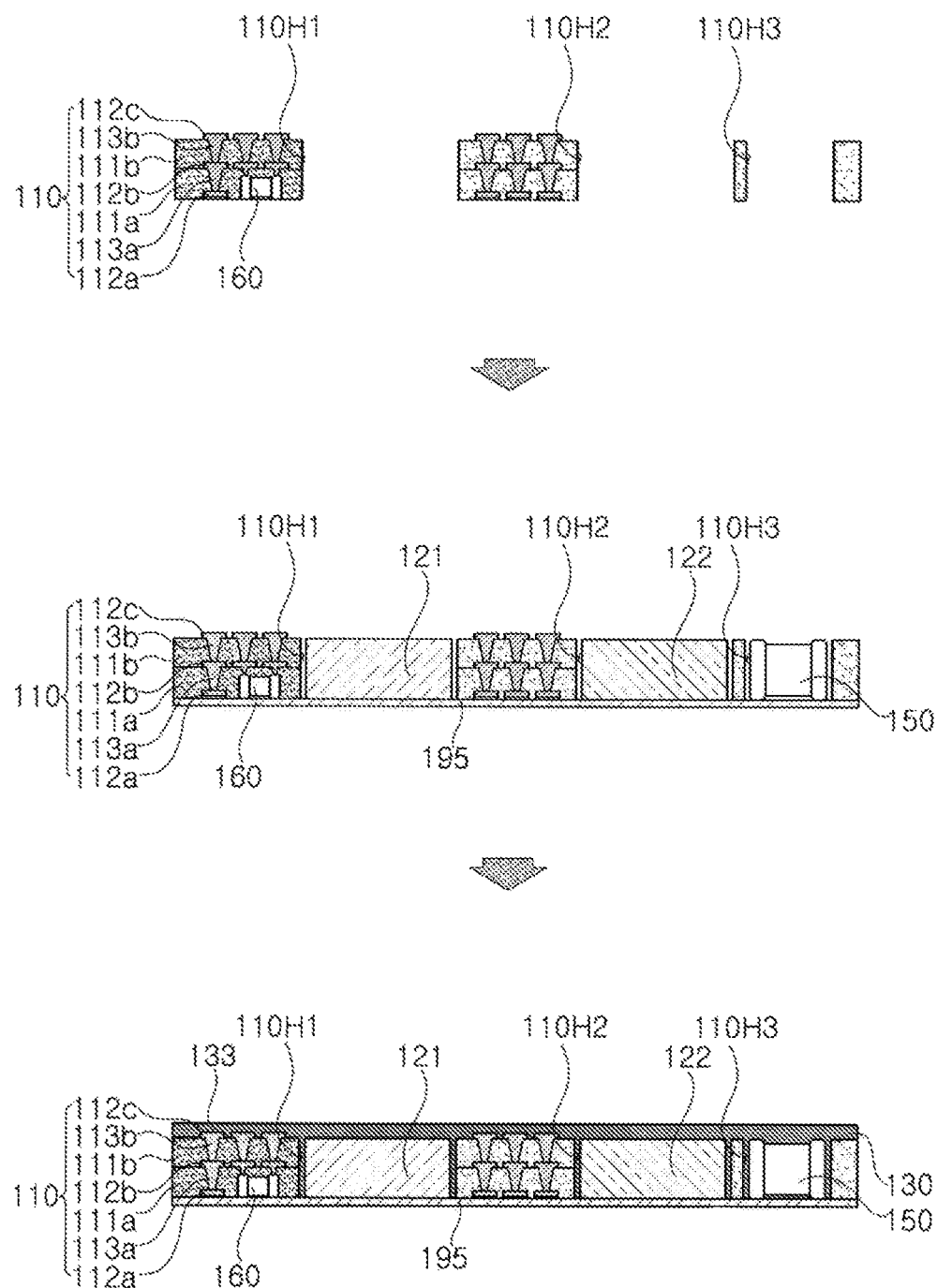
FIGS. 14 to 17 are schematic process views illustrating a manufacturing example of the semiconductor package of FIG. 6.

Referring to FIG. 14, a frame 110 having the first to third through-portions 110H1, 110H2, and 110H3, is prepared. A specific configuration of the frame 110 is as described above. Next, the first bridge 121, the second bridge 122, and a first passive component 150 are disposed on the first to third through portions 110H1, 110H2, and 110H3, using a tape 195, respectively. The first and second bridges 121 and 122 may be disposed by selecting only good products. Next, the frame 110, the first bridge 121, the second bridge 122, and the first passive component 150 are encapsulated with the encapsulant 130.

Figure 15:
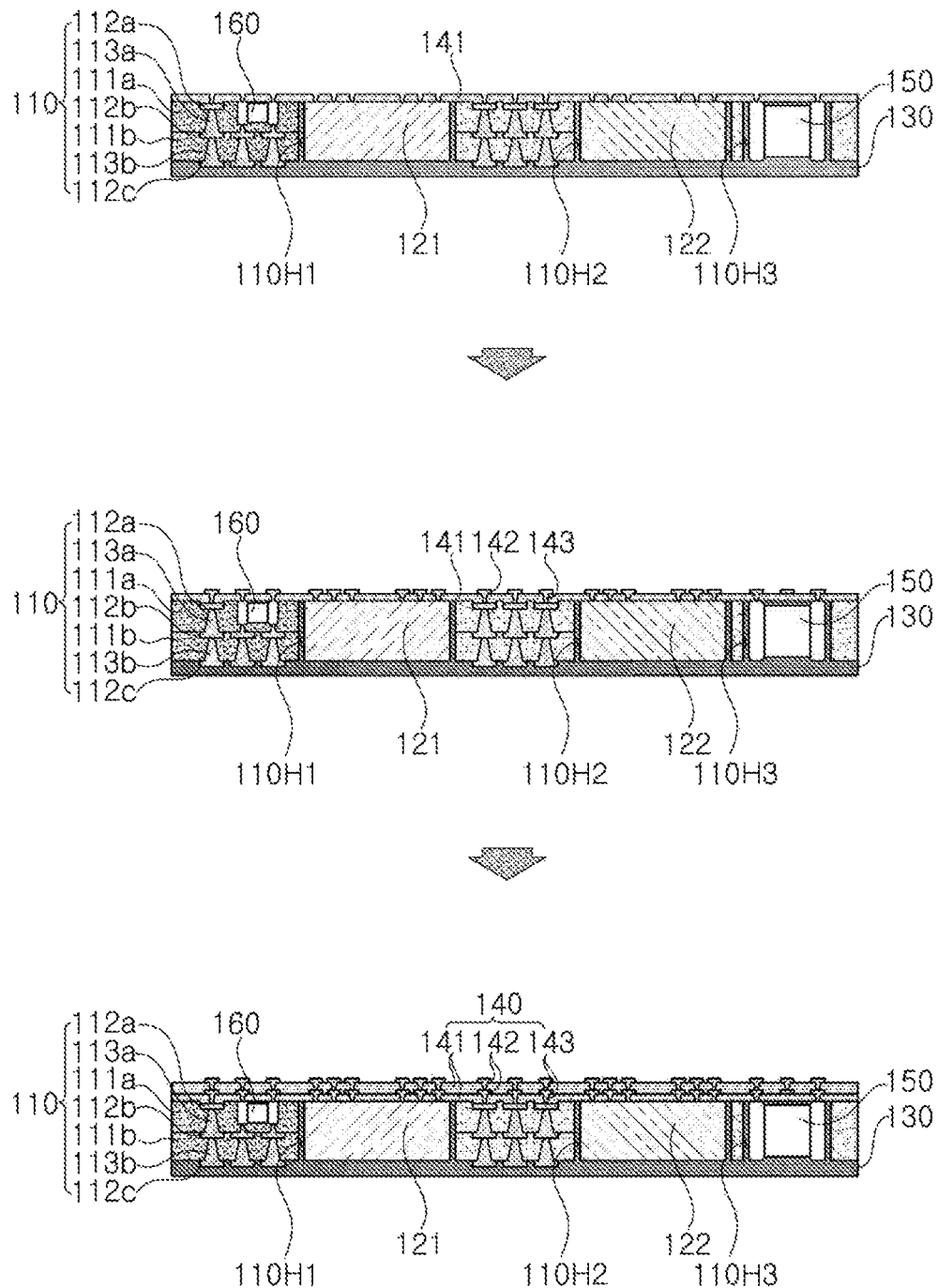

Referring to FIG. 15, next, the tape 195 is removed, and an insulating layer 141 is disposed in a region in which the tape 195 is removed. In addition, an opening is formed in the insulating layer 141 by using a photolithography method. Next, a redistribution layer 142 and a connection via 143 are formed by a plating process. Next, the insulating layer 141, the redistribution layer 142, and the connection via 142 are further formed if necessary, to form the connection structure 140.

Figure 16:
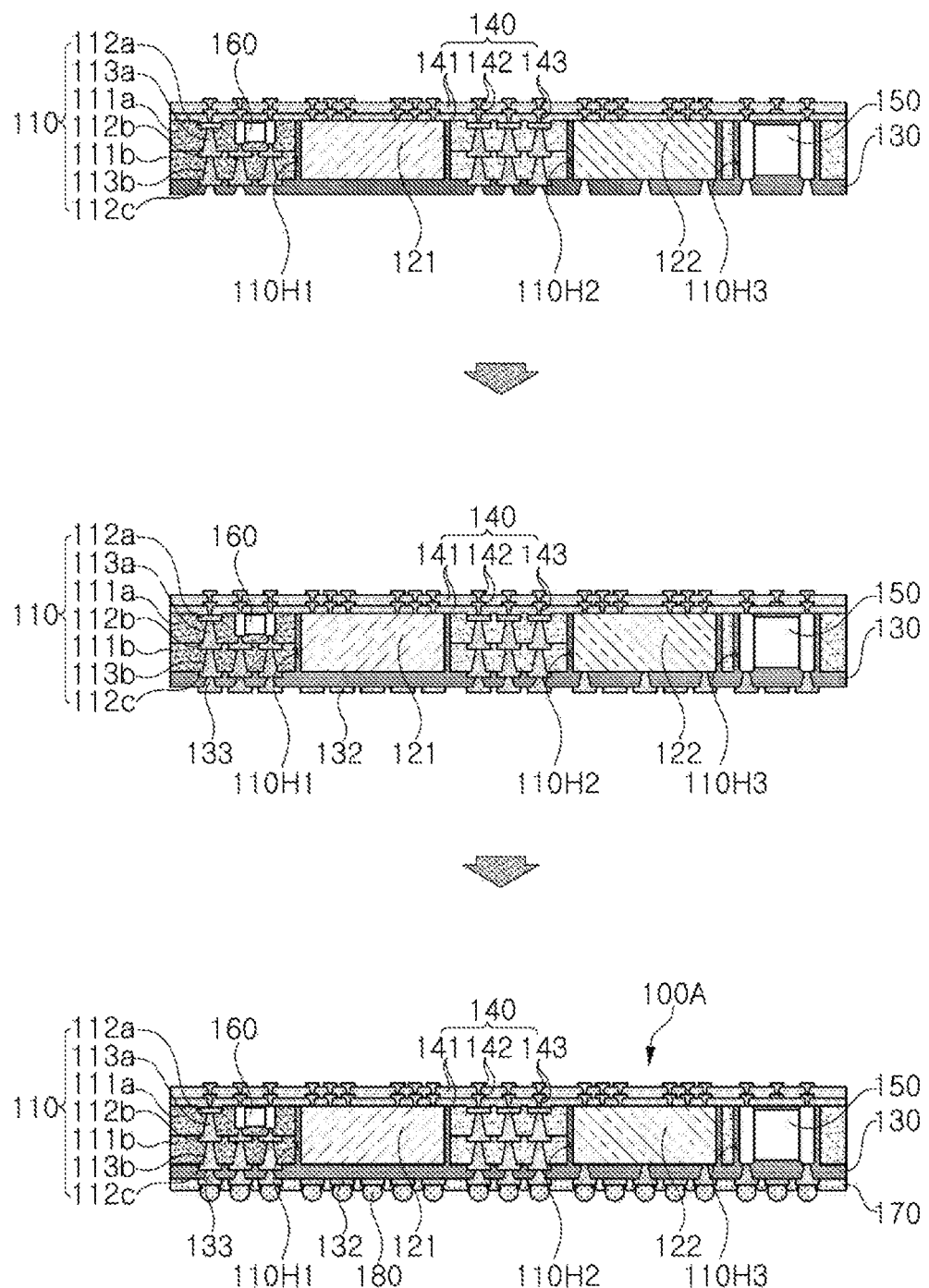

Referring to FIG. 16, next, an opening is formed in the encapsulant 130 using a mechanical drill and/or a laser drill in a required position. Next, the backside wiring layer 132 and the backside via 133 are formed by a plating process. Next, the passivation layer 170 is formed, an opening is formed at a required position of the passivation layer 170, and then a first electrical connection bump 180 is formed using a low melting point metal, or the like. The bridge embedded interposer 100A according to the above-described example may be manufactured through a series of processes. A series of processes may be performed at a panel level of a large-area size, and each of the bridge embedded interposer 100A may be obtained through a singulation process.

Figure 17:
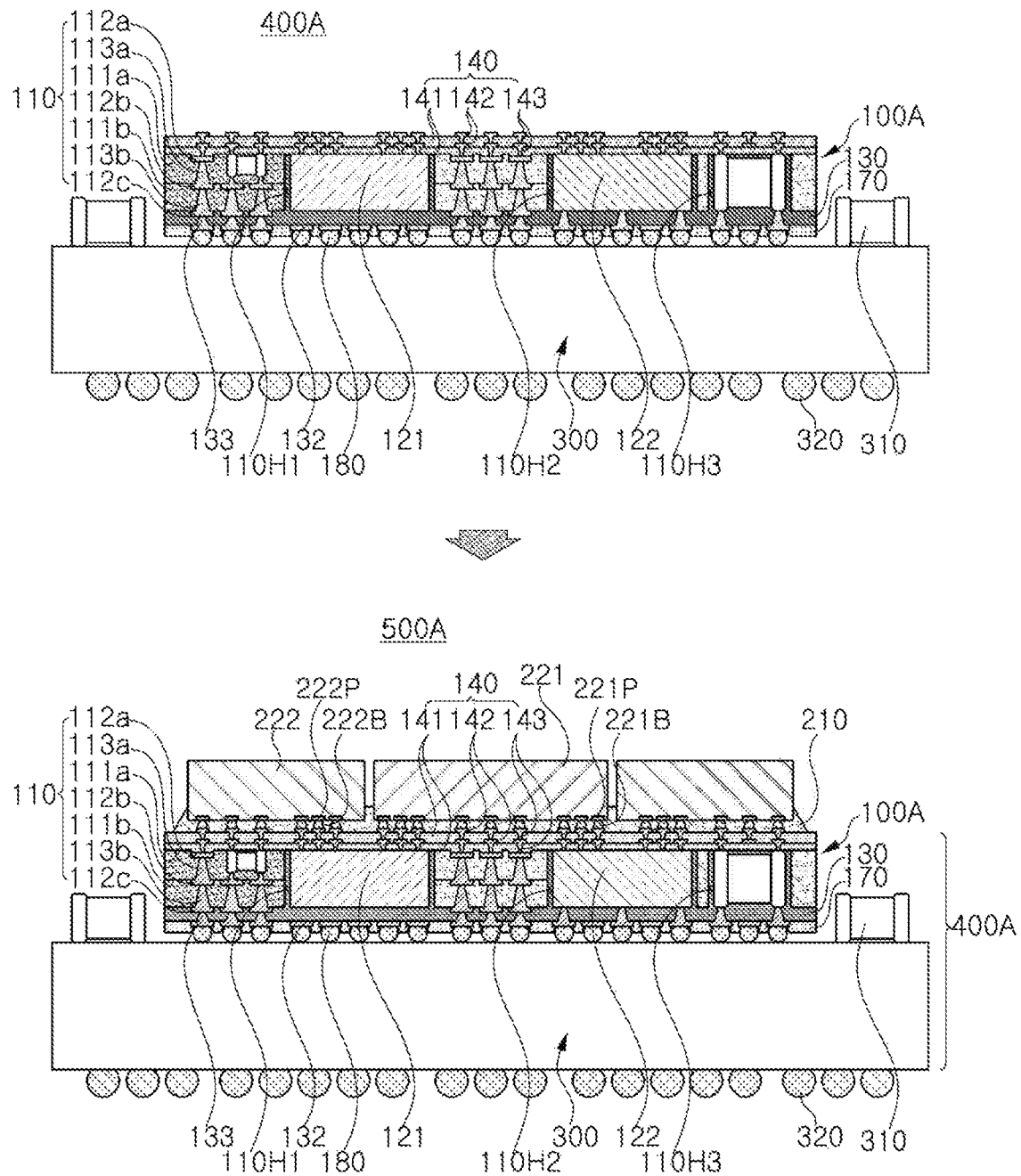

Referring to FIG. 17, next, the bridge embedded interposer 100A manufactured on the printed circuit board 300 is mounted. Specifically, only a good bridge embedded interposer 100A is selected and mounted on a more expensive printed circuit board 300. A third passive component 310 may be disposed on the printed circuit board 300 as required. The printed circuit board 300 may be a BGA substrate having a second electrical connection bump 320, but is not limited thereto. A package substrate 400A according to the above-described example may be manufactured through a series of processes. Next, after the good package substrate 400A is selected, the first and second semiconductor chips 221 and 222, which are more expensive, are mounted on the bridge embedded interposer 100A of the good package substrate 400A using the first and second electrical connection metals 221B and 222B, and are fixed with an underfill resin 210. As a result, a semiconductor package 500A according to the above-described example may be manufactured. Meanwhile, if necessary, the semiconductor package 500A according to an example may have a form in which the printed circuit board 300 is omitted.

Figure 18:
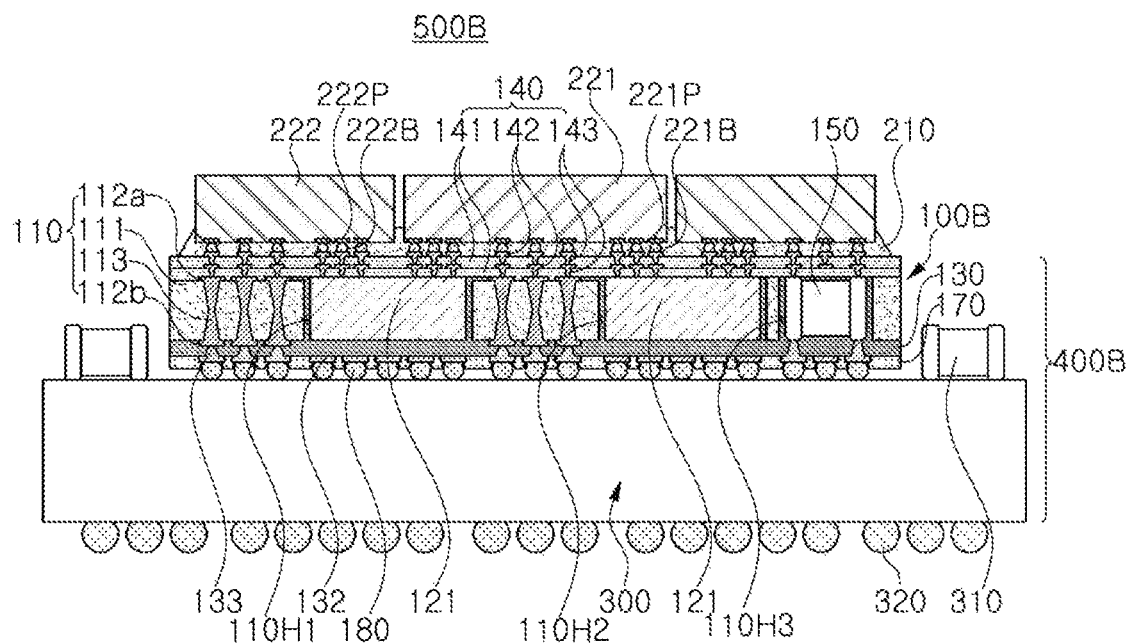
FIG. 18 is a schematic cross-sectional view illustrating another example of a semiconductor package.

FIG. 18 is a schematic cross-sectional view illustrating another example of a semiconductor package.

Referring to FIG. 18, a semiconductor package 500B according to another example may have a different form of a bridge embedded interposer 100B of a package substrate 400B. Specifically, in the bridge embedded interposer 100B according to another example, a frame 110 may include an insulating layer 111, a first wiring layer 112a disposed on one surface of the insulating layer 111, a second wiring layer 112b disposed on the other surface of the insulating layer 111, and a wiring via 113 penetrating the insulating layer and electrically connecting the first and second wiring layers 112a and 112b. That is, the frame 110 may have a more simplified form. Meanwhile, although only a first bridge 121 is illustrated in another example, it is needless to say that a second bridge 122 may be used together instead of the first bridge 121. Other descriptions are substantially the same as those described above, and a detailed description thereof will be omitted.

Figure 19:
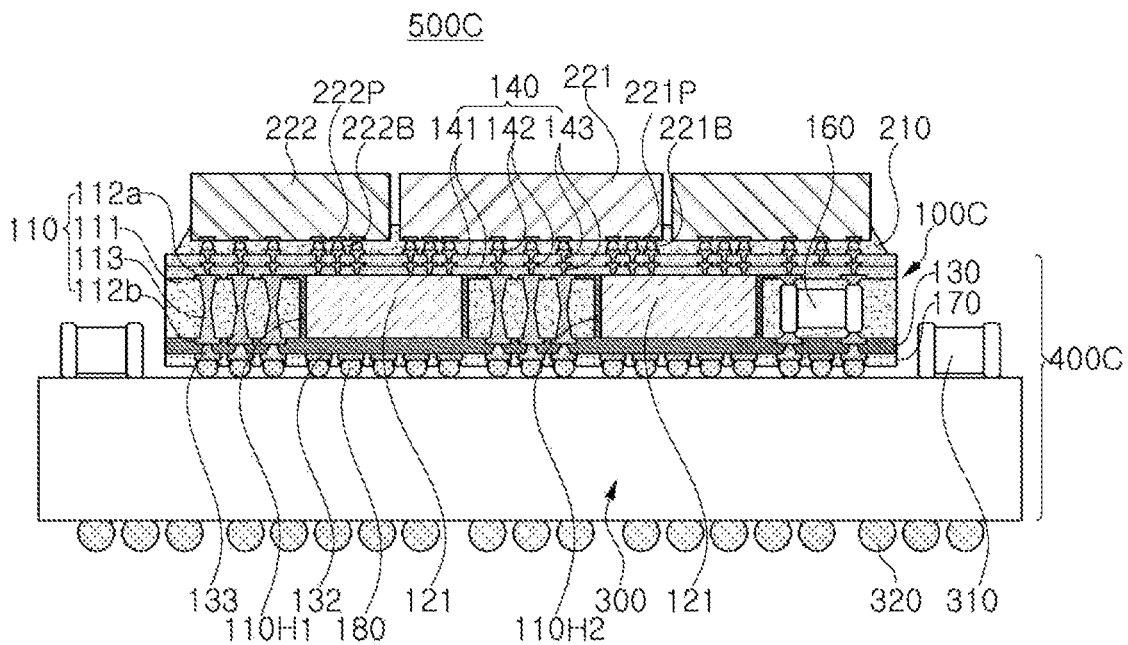
FIG. 19 is a schematic cross-sectional view illustrating another example of a semiconductor package.

FIG. 19 is a schematic cross-sectional view illustrating another example of a semiconductor package.

Referring to FIG. 19, a semiconductor package 500C according to another example may have a different form of a bridge embedded interposer 100C of a package substrate 400C. Specifically, a second passive component 160 is disposed in place of a first passive component 150 in the bridge embedded interposer 100C according to another example, or in the bridge embedded interposer 100B according to the above-described another example. The second passive component 160 is embedded in the frame 110. Other descriptions are substantially the same as those described above, and a detailed description thereof will be omitted.

Figure 20:
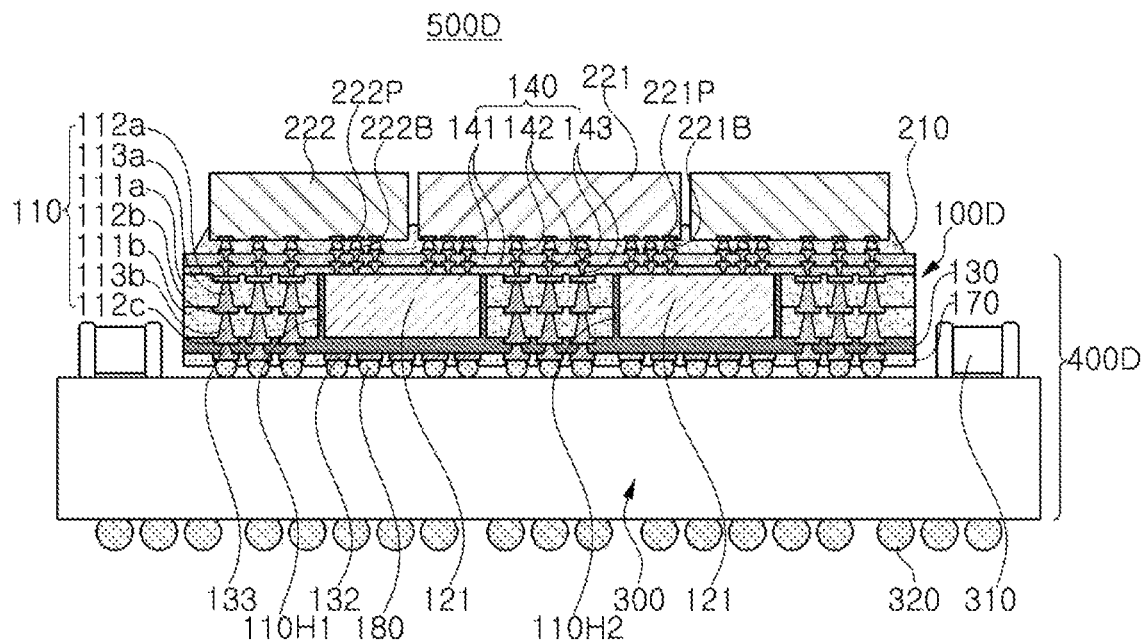
FIG. 20 is a schematic cross-sectional view illustrating another example of a semiconductor package.

FIG. 20 is a schematic cross-sectional view illustrating another example of a semiconductor package.

Referring to FIG. 20, a semiconductor package 500D according to another example may have a different form of a bridge embedded interposer 100D of a package substrate 400D. Specifically, in the bridge embedded interposer 100D according to another example, a third through-hole 110H3 is omitted in the frame 110. In addition, a wiring design of the first to third wiring layers 112a, 112b, and 112c and the first and second wiring vias 113a and 113b is further expanded instead of the disposition of the first and second passive components 150 and 160. Other descriptions are substantially the same as those described above, and a detailed description thereof will be omitted.

Figure 21:
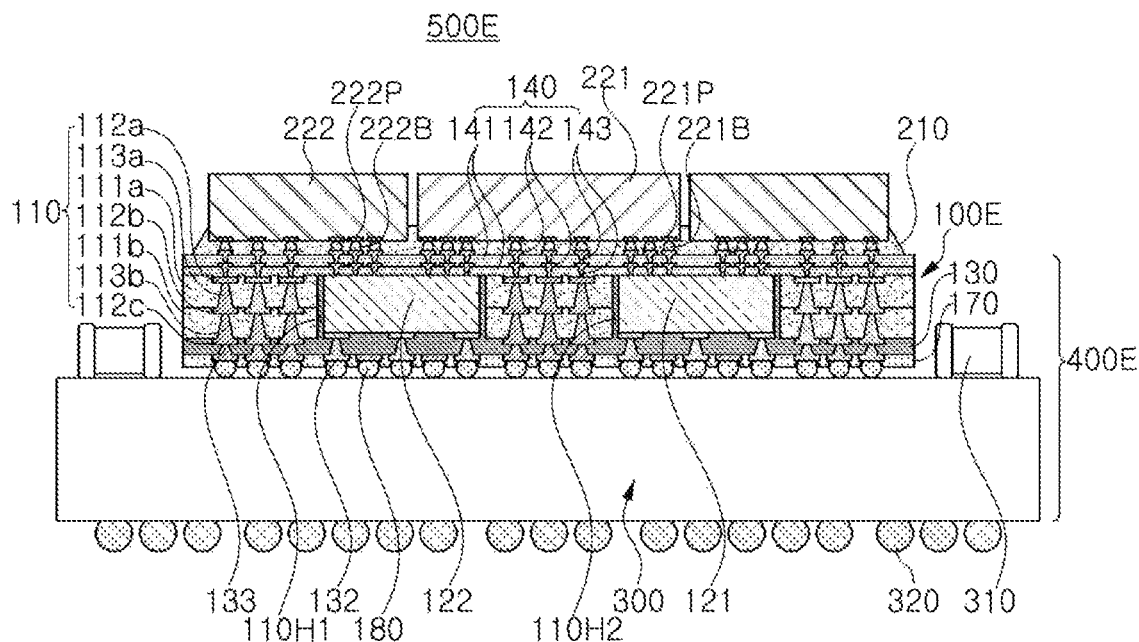
FIG. 21 is a schematic cross-sectional view illustrating another example of a semiconductor package.

FIG. 21 is a schematic cross-sectional view illustrating another example of a semiconductor package.

Referring to FIG. 21, a semiconductor package 500E according to another example may have a different form of a bridge embedded interposer 100E of a package substrate 400E. Specifically, the bridge embedded interposer 100E according to another example is mainly designed for the second bridge 122 in order to significantly reduce a vertical electrical connection path. Other descriptions are substantially the same as those described above, and a detailed description thereof will be omitted.

Figure 22:
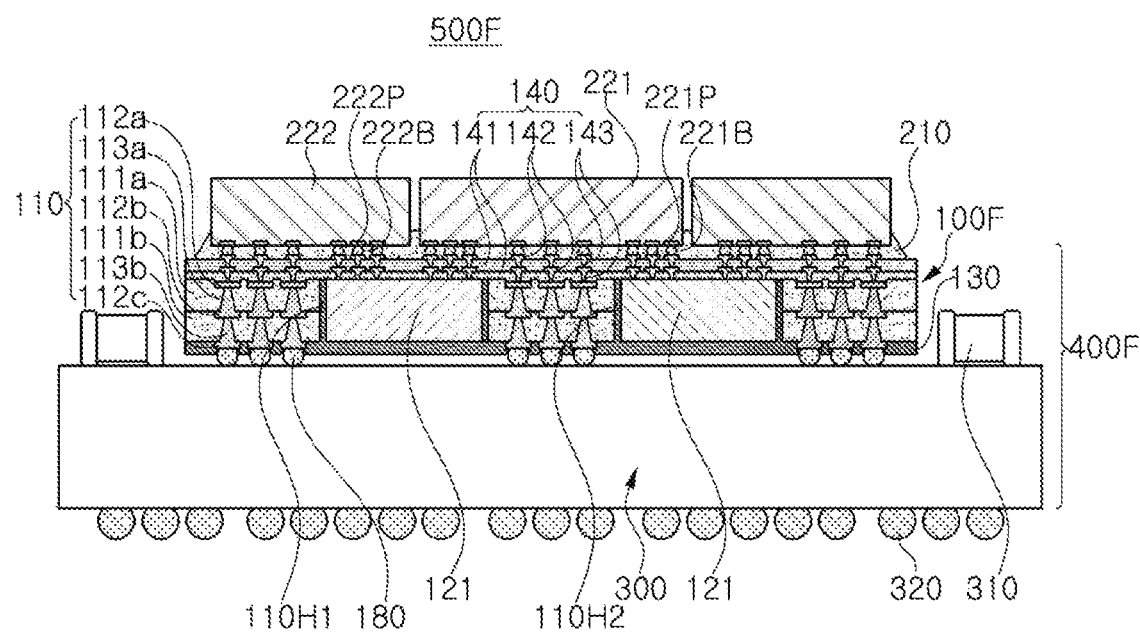
FIG. 22 is a schematic cross-sectional view illustrating another example of a semiconductor package.

FIG. 22 is a schematic cross-sectional view illustrating another example of a semiconductor package.

Referring to FIG. 22, a semiconductor package 500F according to another example may have a different form of a bridge embedded interposer 100F of a package substrate 400F. Specifically, in the bridge embedded interposer 100F according to another example, the backside wiring layer 132, the backside via 133, and the passivation layer 170 are omitted for further thinning. Other descriptions are substantially the same as those described above, and a detailed description thereof will be omitted.

As set forth above, according to the exemplary embodiments in the present disclosure, an interposer, a package substrate and a semiconductor package including the same capable of lowering process difficulty, improving process efficiency and yield, solving a warpage problem, complementing and improving power characteristics, reducing the size, and also being manufactured in large-size may be provided.

Spatially relative terms, such as "above," "upper," "below," and "lower" and the like, may be used herein for ease of description to describe one element's relationship to another element(s) as shown in the figures. It will be understood that spatially relative terms are intended to encompass different orientations of the device in use or operation, in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted alone, in combination or in partial combination.

The terminology used herein describes particular embodiments only, and the present inventive concept is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

While exemplary embodiments have been shown and described above, it will be apparent to those skilled in the art that modifications and variations could be made without departing from the scope of the present invention as defined by the appended claims.

What is claimed is:

1. A bridge embedded interposer, comprising:
   a connection structure including one or more insulating layers made of a photosensitive insulating material and one or more redistribution layers disposed on or in the one or more the insulating layers;
   a first bridge disposed on the connection structure, and including one or more first circuit layers connected to the one or more redistribution layers;
   a frame disposed around the first bridge on the connection structure; and
   an encapsulant disposed on the connection structure, and covering at least a portion of each of the first bridge and the frame,
   wherein the frame comprises:
     first and second insulating layers,
     a first wiring layer disposed on one side of the first insulating layer opposite to another side of the first insulating layer which faces the second insulating layer,
     a second wiring layer disposed between the first insulating layer and the second insulating layer, and disposed on a level of the first bridge,
     a third wiring layer disposed on one side of the second insulating layer opposite to another side of the second insulating layer which faces the first insulating layer,
     a first wiring via in the first insulating layer connecting the first wiring layer and the second wiring layer to each other, and
     a second wiring via in the second insulating layer connecting the second wiring layer and the third wiring layer to each other,
   one or more of the first to third wiring layers are connected to the one or more redistribution layers, and
   one of the one or more insulating layers of the connection structure extends continuously to be in contact with the frame and the first bridge.

2. The bridge embedded interposer of claim 1, wherein the frame has a first through portion,
   the first bridge is disposed in the first through portion, and
   the encapsulant is disposed in at least a portion of the first through portion to separate the first bridge from the frame.

3. The bridge embedded interposer of claim 2, further comprising a second bridge disposed in parallel with the first bridge on the connection structure, and including one or more second circuit layers connected to the one or more redistribution layers, and
   wherein the encapsulant covers at least a portion of the second bridge.

4. The bridge embedded interposer of claim 3, wherein the frame further has a second through portion, spaced apart from the first through portion,
   the second bridge is disposed in the second through portion, and
   the encapsulant is disposed in at least a portion of the second through portion to separate the second bridge from the frame.

5. The bridge embedded interposer of claim 2, further comprising a first passive component disposed in parallel with the first bridge on the connection structure, and connected to the one or more redistribution layers, and
   wherein the encapsulant covers at least a portion of the first passive component.

6. The bridge embedded interposer of claim 5, wherein the frame further has another through portion, spaced apart from the first through portion,
   the first passive component is disposed in the another through portion, and
   the encapsulant is disposed in at least a portion of the another through portion.

7. The bridge embedded interposer of claim 1, further comprising a second passive component embedded in the frame, and connected to the one or more redistribution layers.

8. The bridge embedded interposer of claim 1,
   further comprising a plurality of electrical connection bumps disposed in the encapsulant, and connected to the second wiring layer.

9. The bridge embedded interposer of claim 1, further comprising another wiring layer disposed on one side of the encapsulant opposite to another side of the encapsulant which faces the frame;
   a plurality of first vias penetrating through the encapsulant, respectively, and connecting the another wiring layer to the second wiring layer, respectively;
   a passivation layer disposed on the one side of the encapsulant to cover at least a portion of the another wiring layer; and
   a plurality of electrical connection bumps disposed in the passivation layer, and connected to the another wiring layer, respectively.

10. The bridge embedded interposer of claim 9, wherein the first bridge comprises a base layer, an insulating layer disposed on one side of the base layer, the first circuit layer disposed in the insulating layer, and a first pad layer disposed on one side of the insulating layer and connected to the first circuit layer.

11. The bridge embedded interposer of claim 10, wherein the first bridge further comprises a second pad layer disposed on another side of the base layer, and a through via penetrating the base layer and connecting the second pad layer to the first circuit layer.

12. The bridge embedded interposer of claim 11, further comprising a plurality of second vias penetrating the encapsulant, respectively, and connecting the another wiring layer to the second pad layer, respectively.

13. The bridge embedded interposer of claim 9, wherein the first bridge comprises a plurality of insulating layers, a plurality of pattern layers disposed on or in the plurality of insulating layers, and a plurality of via layers penetrating the plurality of insulating layers, respectively and connecting the plurality of pattern layers disposed at different levels, and
   the first circuit layer comprises at least a portion of the plurality of pattern layers and at least a portion of the plurality of via layers.

14. The bridge embedded interposer of claim 13, further comprising a plurality of second vias penetrating the encapsulant, respectively, and connecting the another wiring layer to one of the plurality of pattern layers, respectively.

15. The bridge embedded interposer of claim 1, further comprising:
   another wiring layer disposed on a lower side of the encapsulant; and
   a via penetrating the encapsulant, and connecting the another wiring layer to the second wiring layer,
   wherein the connection structure includes a connection via connecting one of the one or more redistribution layers to the first wiring layer, and
   the connection via and the via are tapered in opposite directions.

16. A package substrate, comprising:
   a printed circuit board; and
   a bridge embedded interposer disposed on the printed circuit board,
   wherein the bridge embedded interposer comprises a connection structure including one or more insulating layers made of a photosensitive insulating material and one or more redistribution layers disposed on or in the one or more insulating layers, a bridge disposed on the connection structure and including one or more circuit layers connected to the one or more redistribution layers, a frame disposed around the bridge on the connection structure, and an encapsulant disposed on the connection structure and covering at least a portion of each of the bridge and the frame,
   the frame comprises:
      first and second insulating layers,
      a first wiring layer disposed on one side of the first insulating layer opposite to another side of the first insulating layer which faces the second insulating layer,
      a second wiring layer disposed between the first insulating layer and the second insulating layer, and disposed on a level of the first bridge,
      a third wiring layer disposed on one side of the second insulating layer opposite to another side of the second insulating layer which faces the first insulating layer,
      a first wiring via in the first insulating layer connecting the first wiring layer and the second wiring layer to each other, and
      a second wiring via in the second insulating layer connecting the second wiring layer and the third wiring layer to each other,
   one or more of the first to third wiring layers are connected to the one or more redistribution layers,
   one of the one or more insulating layers of the connection structure extends continuously to be in contact with the frame and the bridge,
   the one or more circuit layers are connected to the printed circuit board through the one or more redistribution layers and the first to third wiring layers, and
   one of the first wiring via and the second wiring via is tapered in a direction towards the connection structure.

17. A semiconductor package, comprising:
   a bridge embedded interposer having a connection structure having a first side and a second side opposing the first side, and including one or more insulating layers made of a photosensitive insulating material and one or more redistribution layers disposed on or in the one or more the insulating layers, a bridge disposed on the first side of the connection structure, and including one or more circuit layers connected to the one or more redistribution layers, a frame disposed around the bridge of the first side of the connection structure, and an encapsulant disposed on the first side of the connection structure, and covering at least a portion of each of the bridge and the frame,
   a first semiconductor chip disposed on the second side of the connection structure, and having a plurality of first connection pads connected to the one or more redistribution layers; and
   a second semiconductor chip disposed on the second side of the connection structure, and having a plurality of second connection pads connected to the one or more redistribution layers,
   wherein at least a portion of the plurality of first connection pads and at least a portion of the plurality of second connection pads are connected to each other through the one or more circuit layers,
   the frame comprises:
      first and second insulating layers,
      a first wiring layer disposed on one side of the first insulating layer opposite to another side of the first insulating layer which faces the second insulating layer,
      a second wiring layer disposed between the first insulating layer and the second insulating layer, and disposed on a level of the bridge,
      a third wiring layer disposed on one side of the second insulating layer opposite to another side of the second insulating layer which faces the first insulating layer,
      a first wiring via in the first insulating layer connecting the first wiring layer and the second wiring layer to each other, and
      a second wiring via in the second insulating layer connecting the second wiring layer and the third wiring layer to each other,
   one or more of the first to third wiring layers are connected to the one or more redistribution layers,
   one of the one or more insulating layers of the connection structure extends continuously to be in contact with the frame and the bridge, and
   one of the first wiring via and the second wiring via is tapered in a direction towards the connection structure.

18. The semiconductor package of claim 17, further comprising a plurality of first electrical connection metals disposed on the second side of the connection structure, and connecting the plurality of first connection pads to the one or more redistribution layers;
   a plurality of second electrical connection metals disposed on the second side of the connection structure, and connecting the plurality of second connection pads to the one or more redistribution layers; and
   an underfill resin disposed on the second side of the connection structure, and covering at least a portion of each of the plurality of first and second electrical connection metals.

19. The semiconductor package of claim 17, further comprising a printed circuit board disposed on an opposite side of a side of the bridge embedded interposer in which the first and second semiconductor chips are disposed, and
   wherein the plurality of first and second connection pads are connected to the printed circuit board through the one or more redistribution layers and the first to third wiring layers.

20. The semiconductor package of claim 17, wherein the first semiconductor chip and the second semiconductor chip partially overlap with the bridge, and
one of the plurality of first connection pads and one of the plurality of second connection pads are connected to each other through the one or more redistribution layers and the one or more circuit layers.

\* \* \* \* \*